(12) United States Patent
Lin

(10) Patent No.: US 7,264,991 B1
(45) Date of Patent: Sep. 4, 2007

(54) METHOD OF CONNECTING A CONDUCTIVE TRACE TO A SEMICONDUCTOR CHIP USING CONDUCTIVE ADHESIVE

(75) Inventor: Charles W. C. Lin, Singapore (SG)

(73) Assignee: Bridge Semiconductor Corporation, Taipei (TW)

( * ) Notice: Subject to any disclaimer, the term of this patent is extended or adjusted under 35 U.S.C. 154(b) by 868 days.

(21) Appl. No.: 10/292,273

(22) Filed: Nov. 12, 2002

Related U.S. Application Data

(63) Continuation-in-part of application No. 09/927,216, filed on Aug. 10, 2001, now Pat. No. 6,548,393, which is a continuation-in-part of application No. 09/878,626, filed on Jun. 11, 2001, now Pat. No. 6,653,217, which is a continuation-in-part of application No. 09/687,619, filed on Oct. 13, 2000, now Pat. No. 6,440,835.

(51) Int. Cl.
*H01L 21/44* (2006.01)
(52) U.S. Cl. .................. 438/106; 438/612; 438/618
(58) Field of Classification Search ........... 438/106, 438/612, 618
See application file for complete search history.

(56) References Cited

U.S. PATENT DOCUMENTS

| | | | |
|---|---|---|---|
| 4,288,282 A * | 9/1981 | Brown et al. ............. 216/48 |
| 4,442,967 A | 4/1984 | van de Pas et al. ....... 228/159 |
| 4,661,192 A | 4/1987 | McShane .................. 156/292 |
| 4,717,066 A | 1/1988 | Goldenberg et al. ...... 228/179 |
| 4,750,666 A | 6/1988 | Neugebauer et al. ..... 228/160 |
| 4,807,021 A | 2/1989 | Okumura ................... 357/75 |
| 4,925,083 A | 5/1990 | Farassat et al. ........... 228/102 |
| 4,937,653 A | 6/1990 | Blonder et al. ............ 357/68 |
| 4,955,523 A | 9/1990 | Carlommagno et al. .. 228/179 |
| 4,970,571 A | 11/1990 | Yamakawa et al. ........ 357/71 |
| 4,984,358 A | 1/1991 | Nelson ..................... 29/830 |

(Continued)

FOREIGN PATENT DOCUMENTS

EP    0 718 882 A1    6/1996

(Continued)

OTHER PUBLICATIONS

Markstein et al., "Controlling the Variables in Stencil Printing," Electronic Packaging & Production, Feb. 1997, pp. 48-56.

(Continued)

*Primary Examiner*—Andy Huynh
*Assistant Examiner*—David Goodwin
(74) *Attorney, Agent, or Firm*—David M. Sigmund

(57) ABSTRACT

A method of connecting a conductive trace to a semiconductor chip includes providing a semiconductor chip that includes a conductive pad, providing a conductive trace, then disposing a conductive adhesive between the conductive trace and the chip, thereby mechanically attaching the conductive trace to the chip such that the conductive trace overlaps the pad and the conductive adhesive contacts and is sandwiched between and electrically connects the conductive trace and the pad, and then removing a portion of the conductive adhesive such that the conductive adhesive still contacts and is sandwiched between and electrically connects the conductive trace and the pad and the conductive adhesive no longer electrically connects the conductive trace to a conductor external to the chip.

100 Claims, 30 Drawing Sheets

U.S. PATENT DOCUMENTS

| | | | |
|---|---|---|---|
| 5,014,111 A | 5/1991 | Tsuda et al. | 357/68 |
| 5,060,843 A | 10/1991 | Yasuzato et al. | 228/179 |
| 5,074,947 A | 12/1991 | Estes et al. | 156/307.3 |
| 5,090,119 A | 2/1992 | Tsuda et al. | 29/843 |
| 5,106,461 A | 4/1992 | Volfson et al. | 205/125 |
| 5,116,463 A | 5/1992 | Lin et al. | 156/653 |
| 5,137,845 A | 8/1992 | Lochon et al. | 437/183 |
| 5,167,992 A | 12/1992 | Lin et al. | 427/437 |
| 5,172,851 A | 12/1992 | Matsushita et al. | 228/179 |
| 5,196,371 A | 3/1993 | Kulesza et al. | 437/183 |
| 5,209,817 A | 5/1993 | Ahmad et al. | 156/643 |
| 5,221,642 A * | 6/1993 | Burns | 156/233 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A | 1/1994 | Isaacs et al. | 228/180.2 |
| 5,284,796 A | 2/1994 | Nakanishi et al. | 437/183 |
| 5,293,067 A | 3/1994 | Thompson et al. | 257/668 |
| 5,294,038 A | 3/1994 | Nakano | 228/179.1 |
| 5,327,010 A | 7/1994 | Uenaka et al. | 257/679 |
| 5,334,804 A | 8/1994 | Love et al. | 174/267 |
| 5,346,750 A | 9/1994 | Hatakeyama et al. | 428/209 |
| 5,355,283 A | 10/1994 | Marrs et al. | 361/760 |
| 5,358,621 A | 10/1994 | Oyama | 205/123 |
| 5,364,004 A | 11/1994 | Davidson | 228/1.1 |
| 5,397,921 A | 3/1995 | Karnezos | 257/779 |
| 5,407,864 A | 4/1995 | Kim | 437/203 |
| 5,424,245 A | 6/1995 | Gurtler et al. | 437/183 |
| 5,438,477 A | 8/1995 | Pasch | 361/689 |
| 5,439,162 A | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,485,949 A | 1/1996 | Tomura et al. | 228/180.5 |
| 5,487,218 A | 1/1996 | Bhatt et al. | 29/852 |
| 5,489,804 A | 2/1996 | Pasch | 257/778 |
| 5,493,096 A | 2/1996 | Koh | 219/121.71 |
| 5,508,229 A | 4/1996 | Baker | 437/183 |
| 5,525,065 A | 6/1996 | Sobhani | 439/67 |
| 5,536,973 A | 7/1996 | Yamaji | 257/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/690 |
| 5,576,052 A | 11/1996 | Arledge et al. | 427/98 |
| 5,583,073 A | 12/1996 | Lin et al. | 439/183 |
| 5,595,943 A | 1/1997 | Itabashi et al. | 437/230 |
| 5,599,744 A | 2/1997 | Koh et al. | 437/195 |
| 5,611,140 A | 3/1997 | Kulesza et al. | 29/832 |
| 5,611,884 A | 3/1997 | Bearinger et al. | 156/325 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht, Jr. et al. | 29/852 |
| 5,627,405 A | 5/1997 | Chillara | 257/668 |
| 5,627,406 A | 5/1997 | Pace | 257/700 |
| 5,633,204 A | 5/1997 | Tago et al. | 438/614 |
| 5,637,920 A | 6/1997 | Loo | 257/700 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,654,584 A | 8/1997 | Fujitsu | 257/666 |
| 5,656,858 A | 8/1997 | Kondo et al. | 257/737 |
| 5,663,598 A | 9/1997 | Lake et al. | 257/737 |
| 5,665,652 A | 9/1997 | Shimizu | 438/127 |
| 5,666,008 A | 9/1997 | Tomita et al. | 257/778 |
| 5,669,545 A | 9/1997 | Pham et al. | 228/1.1 |
| 5,674,785 A | 10/1997 | Akram et al. | 437/217 |
| 5,674,787 A | 10/1997 | Zhao et al. | 437/230 |
| 5,682,061 A | 10/1997 | Khandros et al. | 257/666 |
| 5,686,353 A | 11/1997 | Yagi et al. | 437/183 |
| 5,691,041 A | 11/1997 | Frankeny et al. | 428/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/698 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,804,771 A | 9/1998 | McMahon et al. | 174/255 |
| 5,808,360 A | 9/1998 | Akram | 257/738 |
| 5,811,879 A | 9/1998 | Akram | 257/723 |
| 5,813,115 A | 9/1998 | Misawa et al. | 29/832 |
| 5,817,541 A | 10/1998 | Averkiou et al. | 438/107 |
| 5,822,856 A | 10/1998 | Bhatt et al. | 29/832 |
| 5,834,844 A | 11/1998 | Akagawa et al. | 257/734 |
| 5,861,666 A | 1/1999 | Bellaar | 257/686 |
| 5,863,816 A | 1/1999 | Cho | 438/123 |
| 5,870,289 A | 2/1999 | Tokuda et al. | 361/779 |
| 5,883,435 A | 3/1999 | Geffken et al. | 257/758 |
| 5,925,931 A | 7/1999 | Yamamoto | 257/737 |
| 5,949,901 A * | 9/1999 | Nichani et al. | 382/149 |
| 5,994,222 A | 11/1999 | Smith et al. | 438/689 |
| 6,012,224 A | 1/2000 | DiStefano et al. | 29/840 |
| 6,013,877 A | 1/2000 | Degani et al. | 174/264 |
| 6,017,812 A | 1/2000 | Yonezawa et al. | 438/613 |
| 6,018,196 A | 1/2000 | Noddin | 257/777 |
| 6,020,561 A | 2/2000 | Ishida et al. | 174/261 |
| 6,037,665 A | 3/2000 | Miyazaki | 257/773 |
| 6,038,133 A * | 3/2000 | Nakatani et al. | 361/760 |
| 6,046,909 A | 4/2000 | Joy | 361/748 |
| 6,083,820 A * | 7/2000 | Farnworth | 438/614 |
| 6,084,297 A | 7/2000 | Brooks et al. | 257/698 |
| 6,084,781 A | 7/2000 | Klein | 361/771 |
| 6,088,236 A | 7/2000 | Tomura et al. | 361/783 |
| 6,103,552 A | 8/2000 | Lin | 438/113 |
| 6,103,554 A * | 8/2000 | Son et al. | 438/126 |
| 6,103,992 A | 8/2000 | Noddin | 219/121.71 |
| 6,127,204 A | 10/2000 | Isaacs et al. | 438/106 |
| 6,159,770 A | 12/2000 | Tetaka et al. | 438/112 |
| 6,402,970 B1 * | 6/2002 | Lin | 216/13 |
| 6,426,290 B1 * | 7/2002 | Vivares et al. | 438/678 |
| 6,448,108 B1 * | 9/2002 | Lin | 438/107 |
| 6,511,901 B1 * | 1/2003 | Lam et al. | 438/612 |
| 6,534,340 B1 * | 3/2003 | Karpman et al. | 438/113 |
| 6,627,526 B1 * | 9/2003 | Yang et al. | 438/592 |
| 6,699,780 B1 * | 3/2004 | Chiang et al. | 438/612 |

FOREIGN PATENT DOCUMENTS

| | | |
|---|---|---|
| WO | WO97/38563 | 10/1997 |
| WO | WO99/57762 | 11/1999 |

OTHER PUBLICATIONS

Elenius, "Choosing a Flip Chip Bumping Supplier—Technology an IC Package contractor should look for," Advanced Packaging, Mar./Apr. 1998, pp. 70-73.

Erickson, "Wafer Bumping: The Missing Link for DCA," Electronic Packaging & Production, Jul. 1998, pp. 43-46.

Kuchenmeister et al., "Film Chip Interconnection Systems Prepared By Wet Chemical Metallization," IEEE publication 0-7803-4526-6/98, Jun. 1998, 5 pages.

Ghaffarian, "Long Time BGA Assembly Reliability," Advancing Microelectronics, vol. 25, No. 6, Sep./Oct. 1998, pp. 20-23.

U.S. Appl. No. 09/465,024, filed Dec. 16, 1999, entitled "Bumpless Flip Chip Assembly With Solder Via".

U.S. Appl. No. 09/464,562, filed Dec. 16, 1999, entitled "Bumpless Flip Chip Assembly With Strips And Via-Fill".

U.S. Appl. No. 09/464,561, filed Dec. 16, 1999, entitled "Bumpless Flip Chip Assembly With Strips-In-Via And Planting".

U.S. Appl. No. 09/120,408, filed Jul. 22, 1998, entitled "Flip Chip Assembly With Via Interconnection".

U.S. Appl. no. 09/643,212, filed Aug. 22, 2000, entitled "Semiconductor Chip Assembly With Simultaneously Electroplated Contact Terminal and Connection Joint".

U.S. Appl. No. 09/643,214, filed Aug. 22, 2000, entitled "Semiconductor Chip Assembly with Simultaneously Electrolessly Plated Contact Terminal and Connection Joint".

U.S. Appl. No. 09/643,213, filed Aug. 22, 2000, entitled "Method Of Making A Support Circuit For A Semiconductor Chip Assembly".

U.S. Appl. No. 09/643,445, filed Aug. 22, 2000, entitled "Method Of Making A Semiconductor Chip Assembly".

U.S. Appl. No. 09/665,928, filed Sep. 20, 2000, entitled "Semiconductor Chip Assembly With Ball Bond Connection Joint".

U.S. Appl. No. 09/665,931, filed Sep. 20, 2000, entitled "Method Of Making A Support Circuit With A Tapered Through-Hole For A Semiconductor Chip Assembly".

U.S. Appl. No. 09/677,207, filed Oct. 2, 2000, entitled "Method Of Making A Semiconductor Chip Assembly With A Conductive Trace Subtractively Formed Before And After Chip Attachmet".

U.S. Appl. No. 09/865,367, filed May 24, 2001, entitled "Semiconductor Chip Assembly With Simultaneously Electroplated Contact Terminal and Connection Joint".

U.S. Appl. No. 09/864,555, filed May 24, 2001, entitled "Semiconductor Chip Assembly with Simultaneously Electrolessly Plated Contact Terminal and connection Joint".

U.S. Appl. No. 09/864,773, filed May 24, 2001, entitled "Semiconductor Chip Assembly With Ball Bond Connection Joint".

* cited by examiner

METHOD OF CONNECTING A CONDUCTIVE TRACE TO A SEMICONDUCTOR CHIP USING CONDUCTIVE ADHESIVE

CROSS-REFERENCE TO RELATED APPLICATIONS

This application is a continuation-in-part of U.S. application Ser. No. 09/927,216 filed Aug. 10, 2001 now U.S. Pat. No. 6,548,393, which is a continuation-in-part of U.S. application Ser. No. 09/878,626 filed Jun. 11, 2001 now U.S. Pat. No. 6,653,217, which is a continuation-in-part of U.S. application Ser. No. 09/687,619 filed Oct. 13, 2000 (now U.S. Pat. No. 6,440,835), each of which is incorporated by reference.

BACKGROUND OF THE INVENTION

1. Field of the Invention

The present invention relates to a semiconductor chip assembly, and more particularly to a method of mechanically and electrically connecting a conductive trace to a semiconductor chip.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip. Thermosonic bonding is similar to thermocompression bonding but adds ultrasonic vibration as the ball and wedge bonds are formed so that less heat is necessary. Ultrasonic bonding uses aluminum wire to form wedge bonds without applying heat. There are many variations on these basic methods.

TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps. A major advantage of flip-chip bonding over wiring bonding and TAB is that it provides shorter connection paths between the chip and the external circuitry, and therefore has better electrical characteristics such as less inductive noise, crosstalk, propagation delay and waveform distortion. In addition, flip-chip bonding requires minimal mounting area and weight which results in overall cost saving since no extra packaging and less circuit board space are used.

While flip-chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost.

Other techniques besides wire bonding, TAB and flip-chip technologies have been developed to provide connection joints that electrically connect pads on chips to external conductive traces. These connection joints can be formed by electroplated metal, electrolessly plated metal, solder or conductive adhesive.

Electroplating provides deposition of an adherent metallic coating onto a conductive object placed into an electrolytic bath composed of a solution of the salt of the metal to be plated. Using the terminal as an anode (possibly of the same metal as the one used for plating), a DC current is passed through the solution affecting transfer of metal ions onto the cathode surface. As a result, the metal continually electroplates on the cathode surface. Electroplating using AC current has also been developed. Electroplating is relatively fast and easy to control. However, a plating bus is needed to supply current where electroplating is desired. The plating bus creates design constraints and must be removed after the electroplating occurs. Non-uniform plating may arise at the bottom of relatively deep through-holes due to poor current density distribution. Furthermore, the electrolytic bath is relatively expensive.

Electroless plating provides metal deposition by an exchange reaction between metal complexes in a solution and a catalytic metal that activates or initiates the reaction. As a result, the electroless metal continually plates (i.e., deposits or grows) on the catalytic metal. Advantageously, the reaction does not require externally applied electric current. Therefore, electroless plating can proceed without a plating bus. However, electroless plating is relatively slow. Furthermore, the electroless bath is relatively expensive.

Solder joints are relatively inexpensive, but exhibit increased electrical resistance as well as cracks and voids over time due to fatigue from thermo-mechanical stresses. Further, the solder is typically a tin-lead alloy and lead-based materials are becoming far less popular due to environmental concerns over disposing of toxic materials and leaching of toxic materials into ground water supplies.

Conductive adhesive joints with conductive fillers in polymer binders are relatively inexpensive, but do not normally form a metallurgical interface in the classical sense. Moisture penetration through the polymer binder may induce corrosion or oxidation of the conductive filler particles resulting in an unstable electrical connection. Furthermore, the polymer binder and the conductive filler may degrade leading to an unstable electrical connection. Thus, the conductive adhesive may have adequate mechanical strength but poor electrical characteristics. Nevertheless, semiconductive adhesive is firmly established as a polymeric die attach and flip-chip bump material and has sufficient reliability and electrical conductivity for many applications such as low cost consumer electronics.

Accordingly, each of these connection joint techniques has various advantages and disadvantages. The optimal approach for a given application depends on design, reliability and cost considerations.

In view of the various development stages and limitations in currently available semiconductor chip assemblies, there is a need for a semiconductor chip assembly that is cost-effective, manufacturable, and makes advantageous use of conductive adhesive connection joints.

SUMMARY OF THE INVENTION

An object of the present invention is to provide a semiconductor chip assembly with a chip, a conductive trace and a conductive adhesive connection joint.

Another object of the present invention is to provide a convenient, cost-effective method for manufacturing semiconductor chip assemblies as chip scale packages, chip size packages, grid arrays or other structures.

In accordance with an aspect of the invention, a method of connecting a conductive trace to a semiconductor chip includes providing a semiconductor chip that includes a conductive pad, providing a conductive trace, then disposing a conductive adhesive between the conductive trace and the chip, thereby mechanically attaching the conductive trace to the chip such that the conductive trace overlaps the pad and the conductive adhesive contacts and is sandwiched between and electrically connects the conductive trace and the pad, and then removing a portion of the conductive adhesive such that the conductive adhesive still contacts and is sandwiched between and electrically connects the conductive trace and the pad and the conductive adhesive no longer electrically connects the conductive trace to a conductor external to the chip.

The method may include disposing the conductive adhesive on the entire upper surface of the chip. Alternatively, the method may include disposing an insulative adhesive on the entire upper surface of the chip, forming an opening in the insulative adhesive that exposes the pad, and then disposing the conductive adhesive between the conductive trace and the insulative adhesive and inside the opening.

The method may include removing the portion of the conductive adhesive using the conductive trace as an etch mask.

The method may include removing the portion of the conductive adhesive by attacking a polymer binder of the conductive adhesive using a plasma that chemically reacts with the polymer binder or a laser that ablates the polymer binder and then displacing a filler metal powder of the conductive adhesive using mechanical brushing, sand blasting, air blowing, water rinsing or wet chemical etching.

The method may include removing the portion of the conductive adhesive such that the conductive trace becomes electrically isolated from another conductive trace that is electrically connected to another pad by the conductive adhesive.

The method may include attaching the conductive trace to a metal base, then disposing the conductive adhesive between the conductive trace and the chip, then etching the metal base to expose the conductive trace and the conductive adhesive, and then removing the portion of the conductive adhesive.

An advantage of the present invention is that the semiconductor chip assembly can be manufactured conveniently and cost effectively. Another advantage is that the assembly need not include wire bonds, TAB leads or solder joints. Another advantage is that the assembly can be manufactured using low temperature processes which reduces stress and improves reliability. A further advantage is that the assembly can be manufactured using well-controlled processes which can be easily implemented by circuit board, lead frame and tape manufacturers. Still another advantage is that the assembly can be manufactured using materials that are compatible with copper chip and lead-free environmental requirements. Still another advantage is that the assembly is well-suited for low cost consumer electronics.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
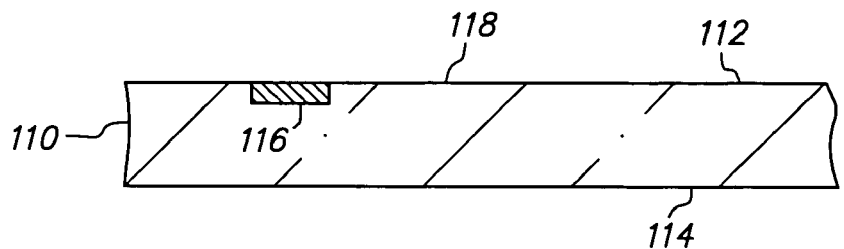
FIGS. 1A-1J are cross-sectional views showing a method of connecting a conductive trace to a semiconductor chip in accordance with a first embodiment of the present invention.
Figure 2A:
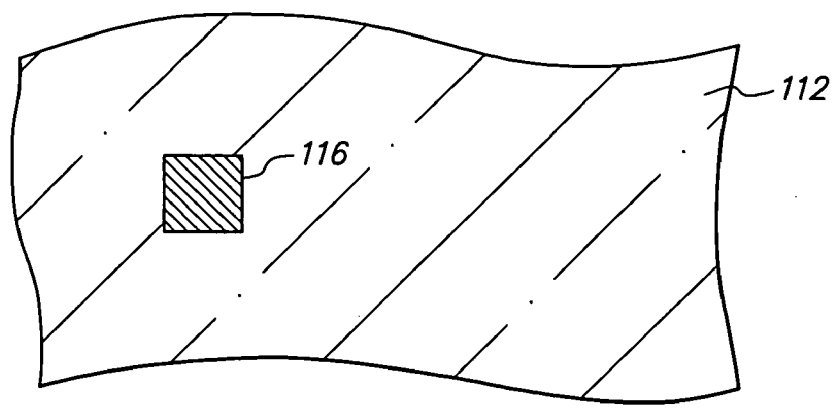
FIGS. 2A-2J are top plan views corresponding to FIGS. 1A-1J, respectively.
Figure 3A:
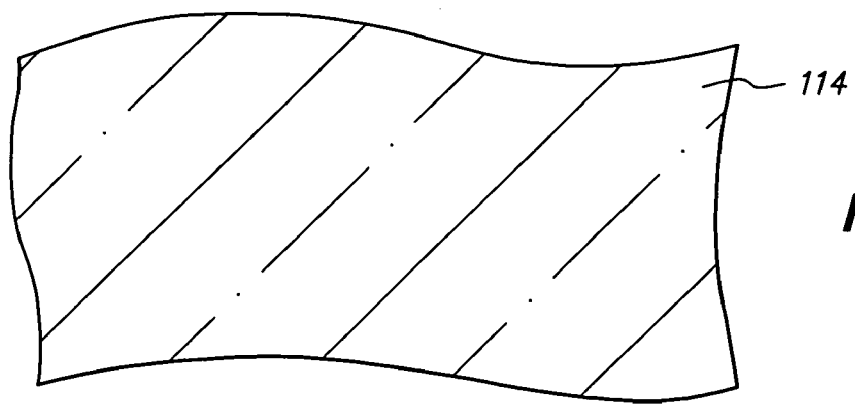
FIGS. 3A-3J are bottom plan views corresponding to FIGS. 1A-1J, respectively.
Figure 1B:
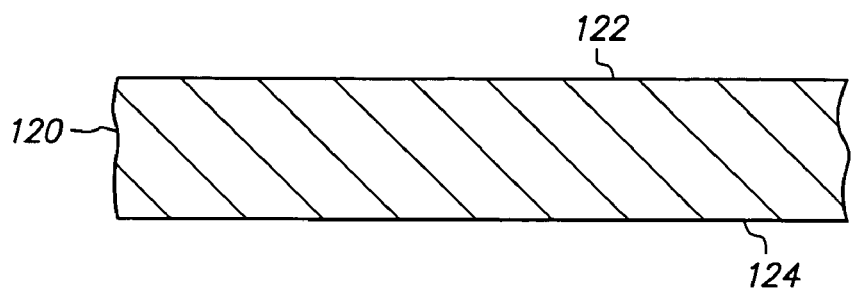
Figure 2B:
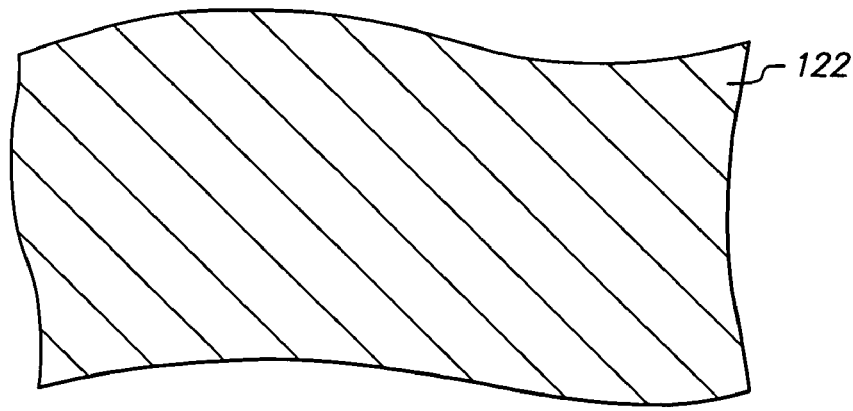
Figure 3B:
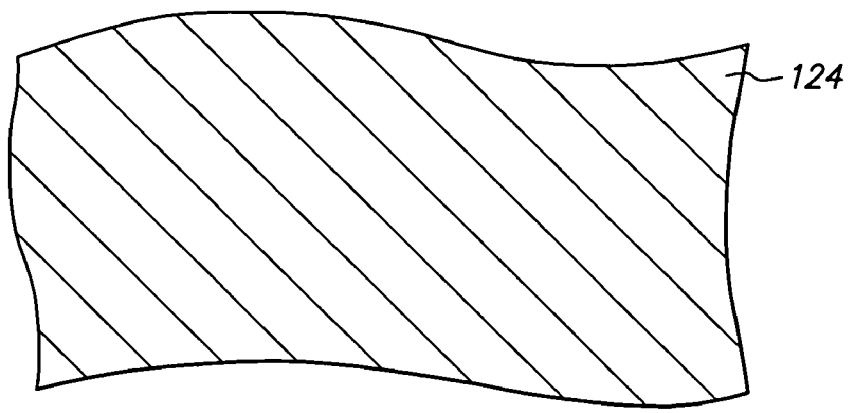
Figure 1C:
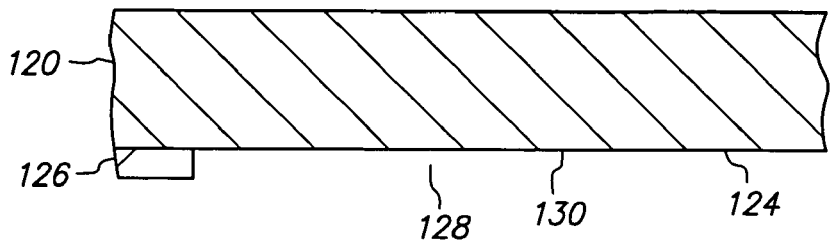
Figure 2C:
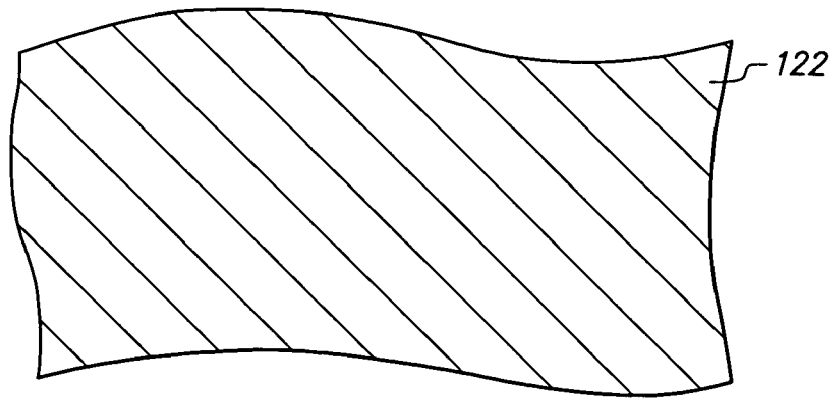
Figure 3C:
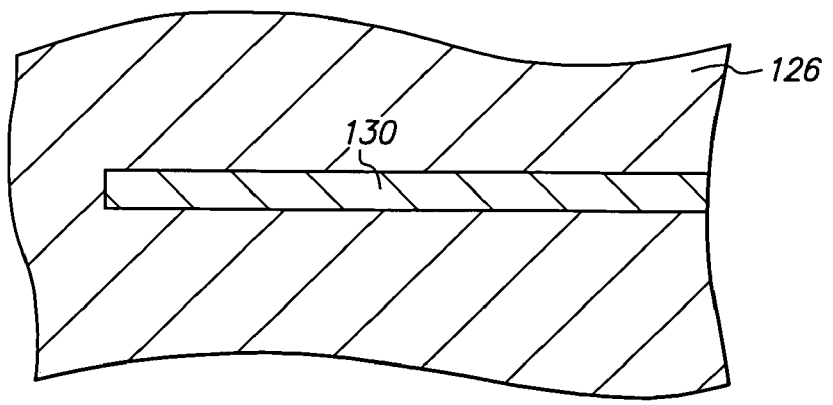
Figure 1D:
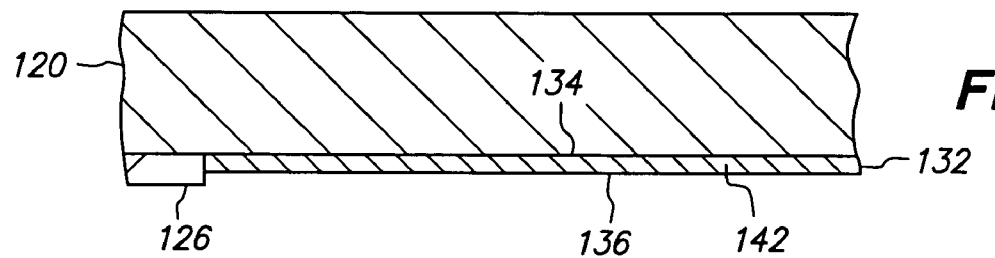
Figure 2D:
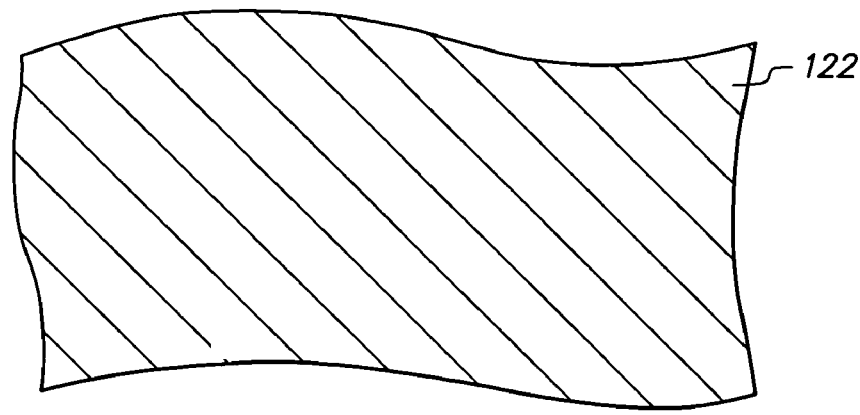
Figure 3D:
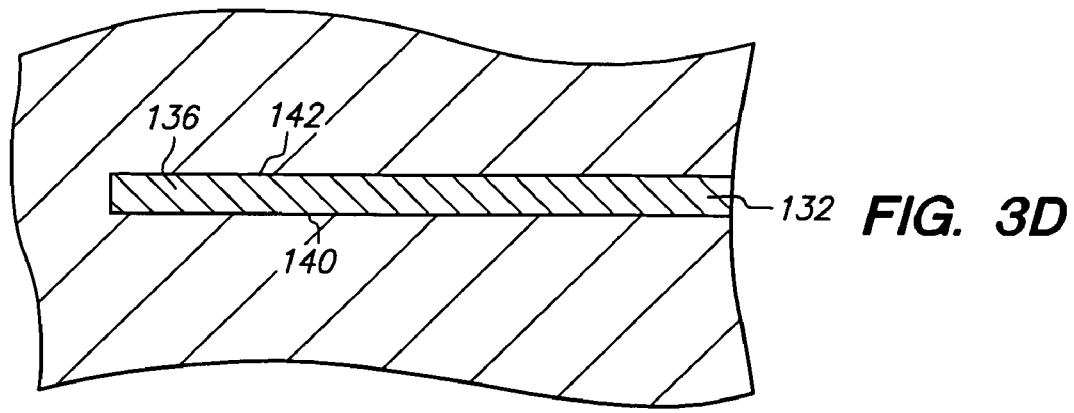
Figure 1E:
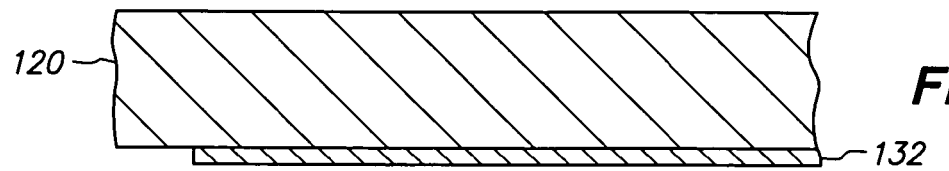
Figure 2E:
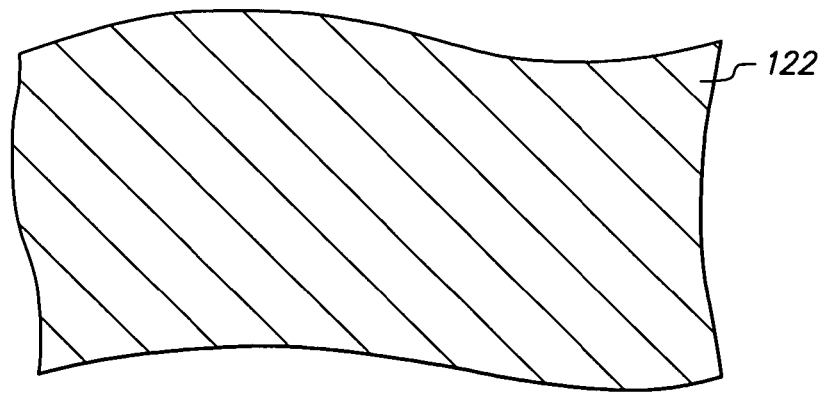
Figure 3E:
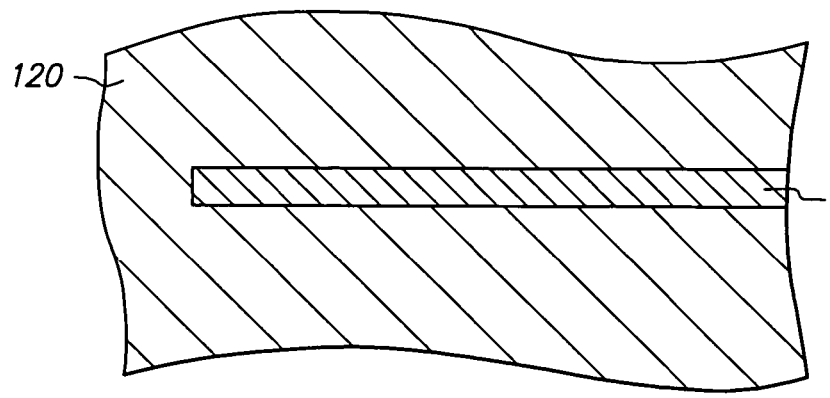
Figure 1F:
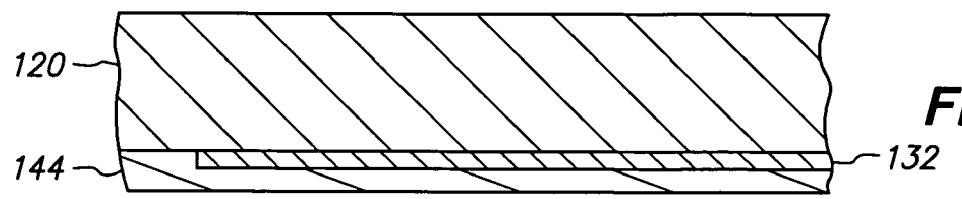
Figure 2F:
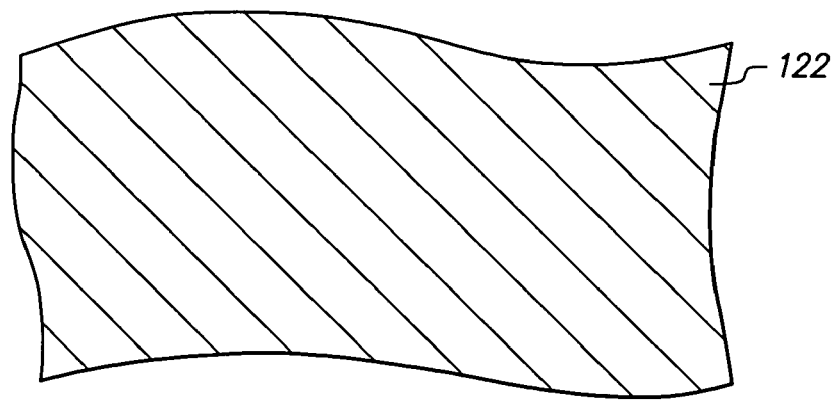
Figure 3F:
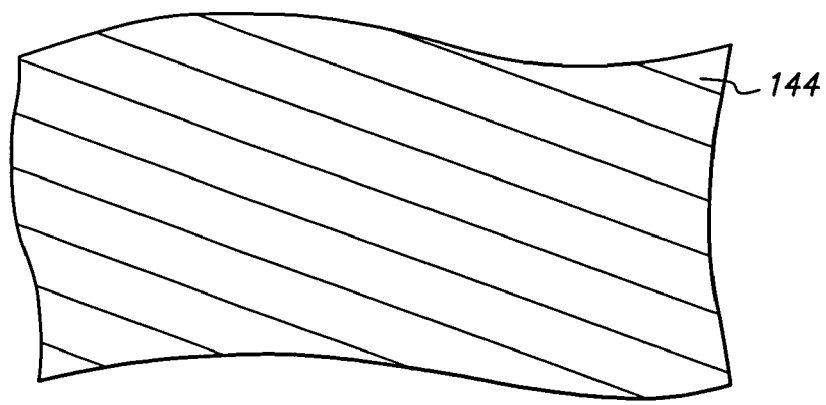
Figure 1G:
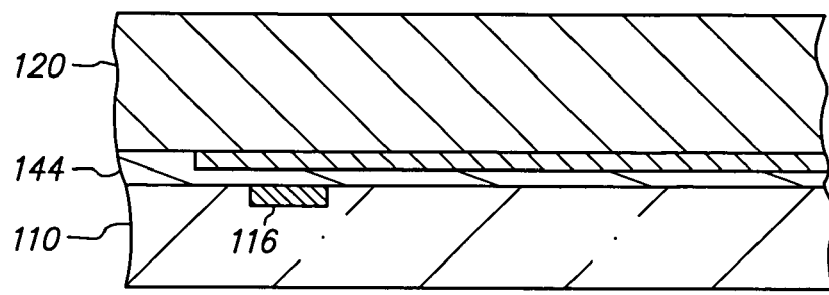
Figure 2G:
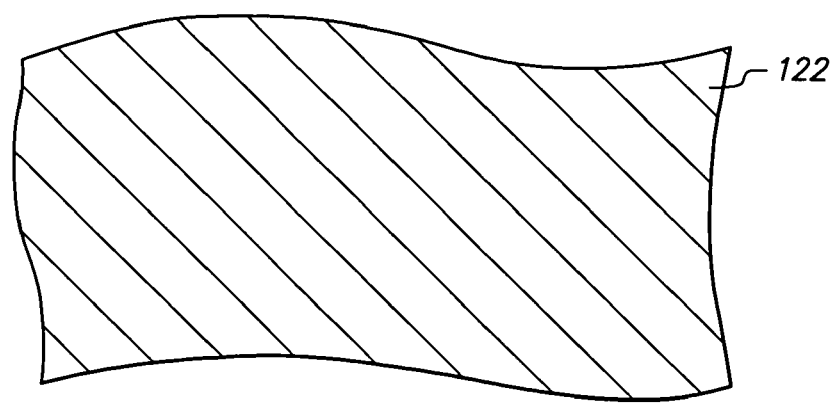
Figure 3G:
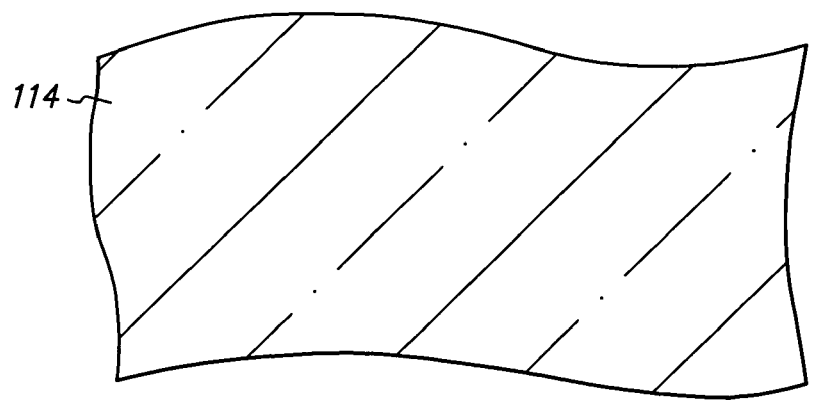
Figure 1H:
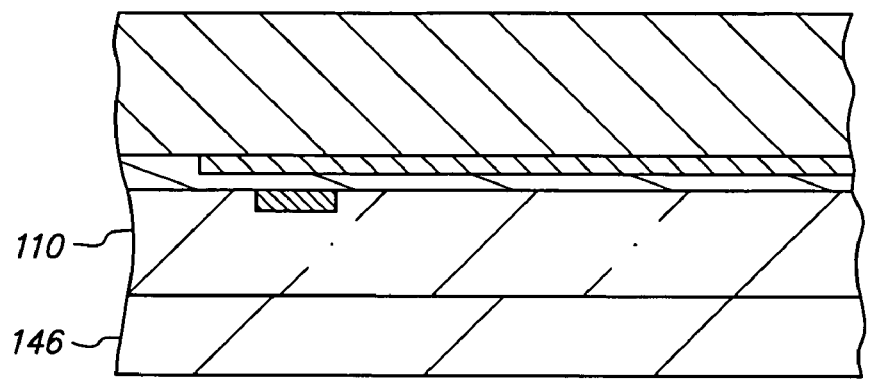
Figure 2H:
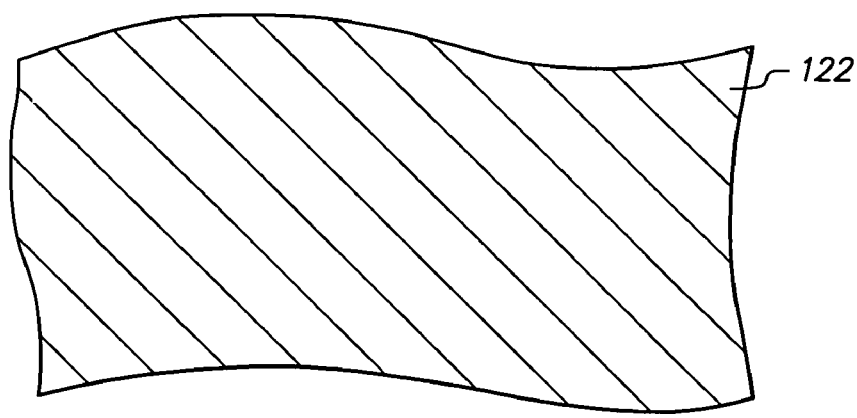
Figure 3H:
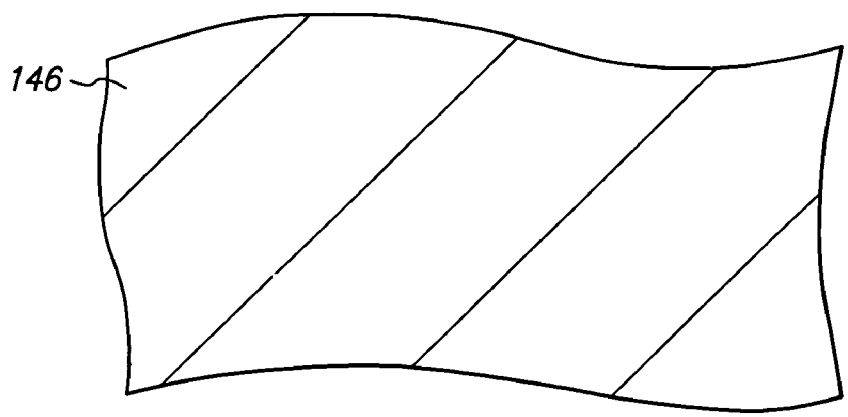
Figure 1I:
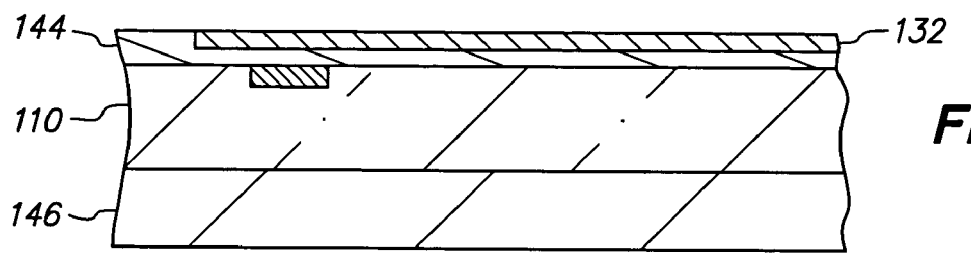
Figure 2I:
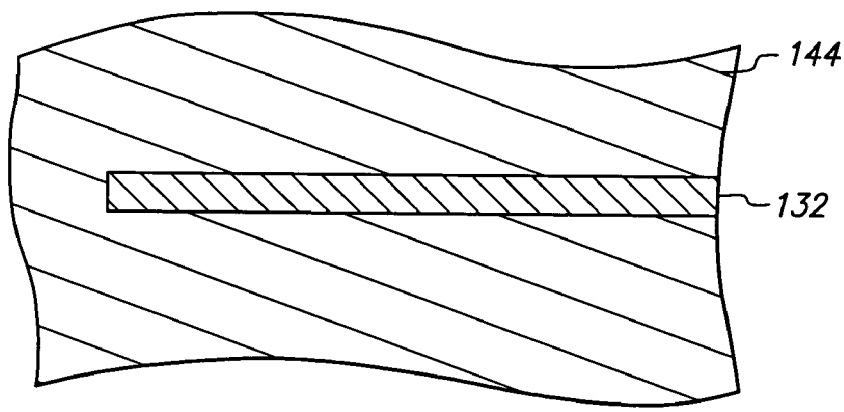
Figure 3I:
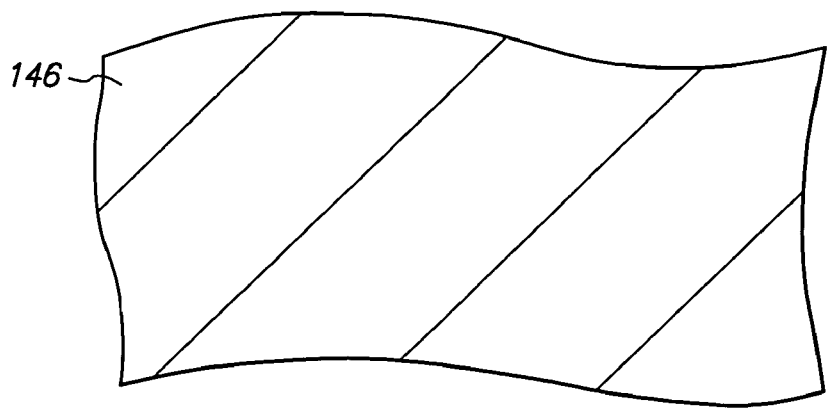
Figure 1J:
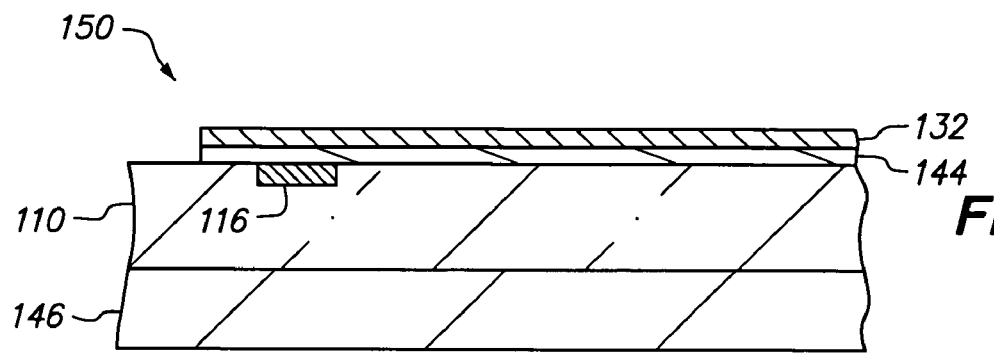
Figure 2J:
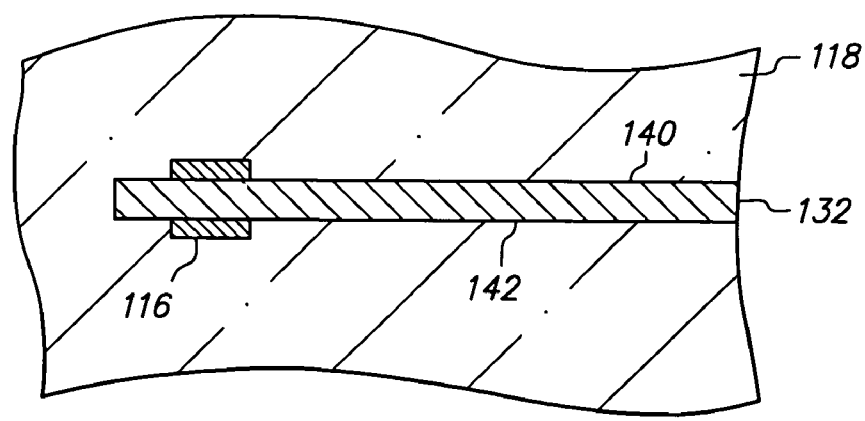
Figure 3J:
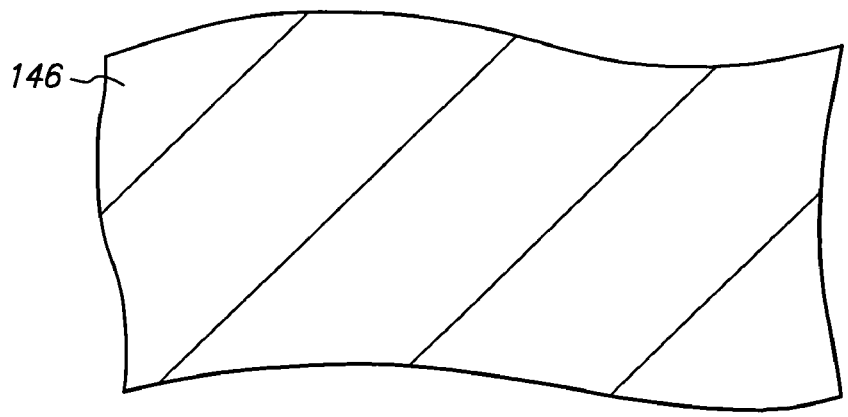
Figure 4A:
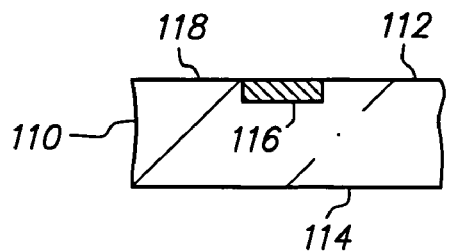
FIGS. 4A-4J are cross-sectional views corresponding to FIGS. 1A-1J, respectively.
Figure 4B:
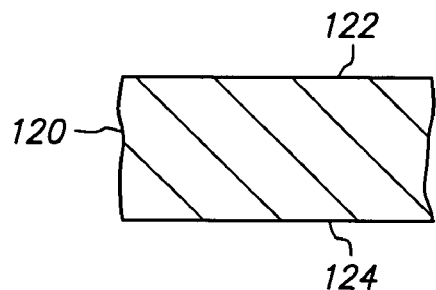
Figure 4C:
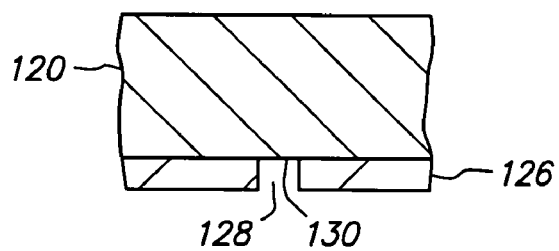
Figure 4D:
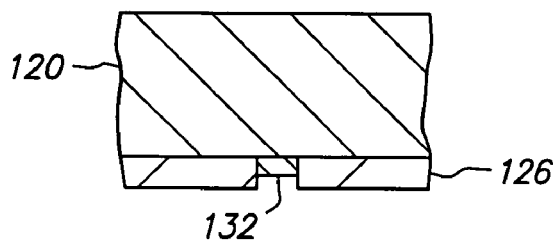
Figure 4E:
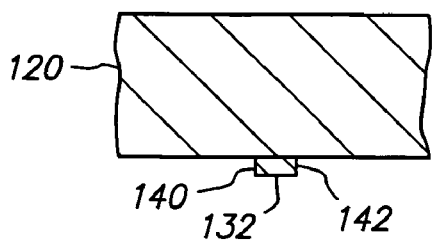
Figure 4F:
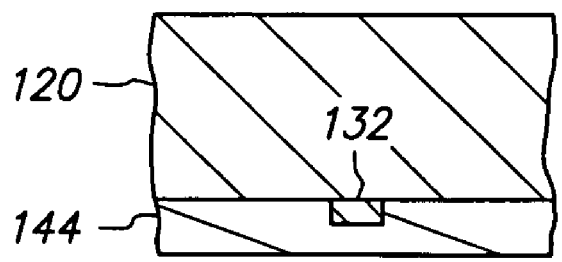
Figure 4G:
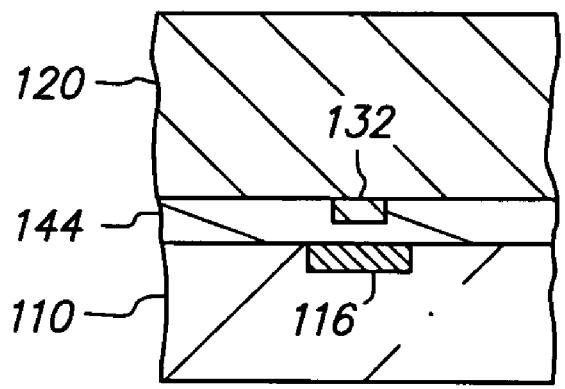
Figure 4H:
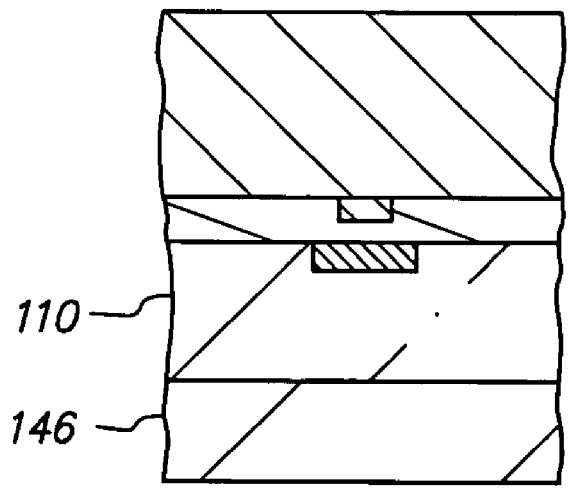
Figure 4I:
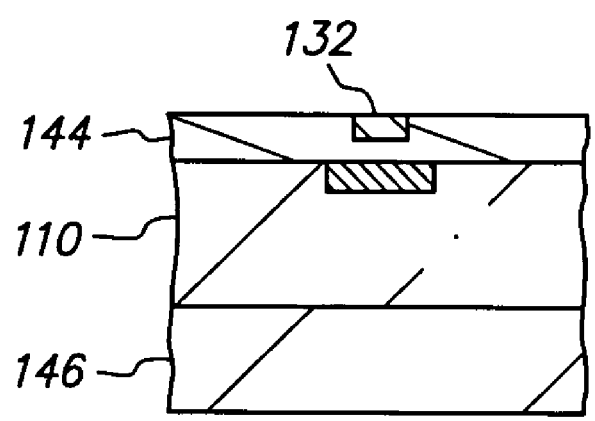
Figure 4J:
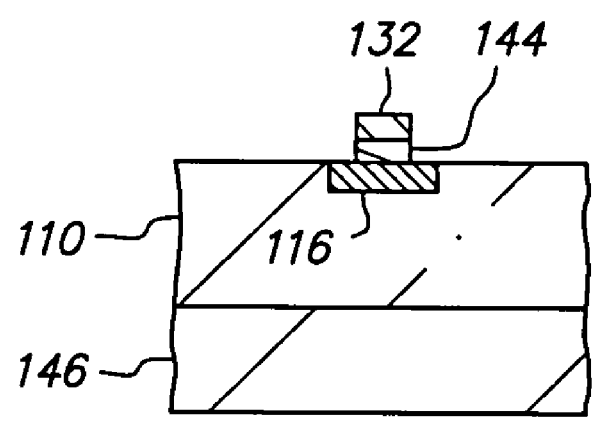
Figure 5A:
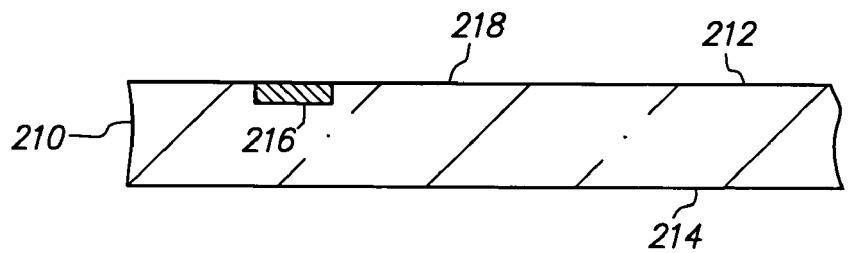
FIGS. 5A-5L are cross-sectional views showing a method of connecting a conductive trace to a semiconductor chip in accordance with a second embodiment of the present invention.
Figure 6A:
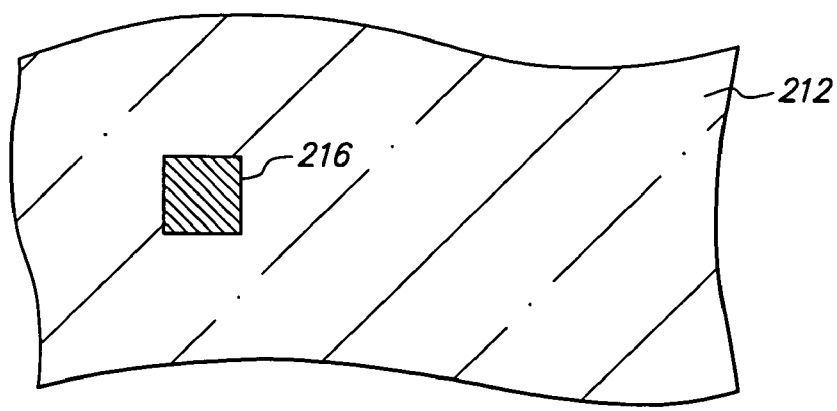
FIGS. 6A-6L are top plan views corresponding to FIGS. 5A-5L, respectively.
Figure 7A:
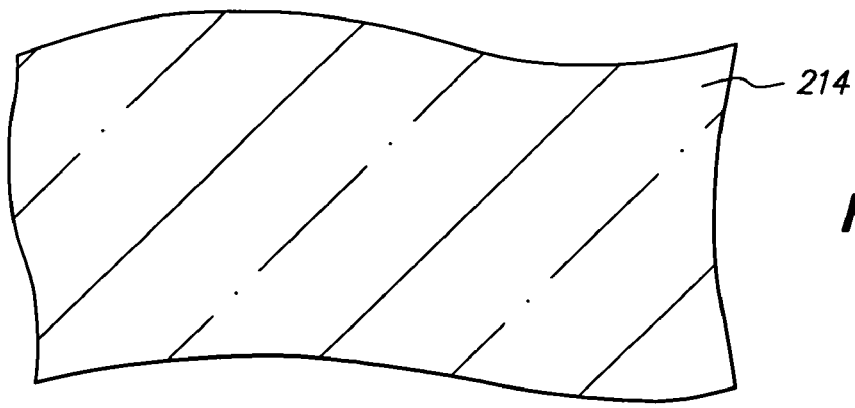
FIGS. 7A-7L are bottom plan views corresponding to FIGS. 5A-5L, respectively.
Figure 5B:
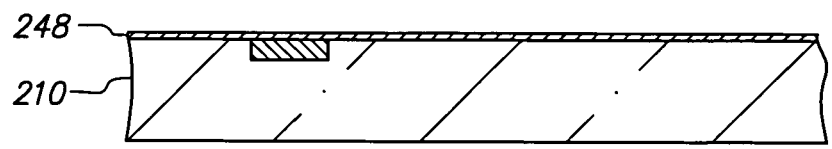
Figure 6B:
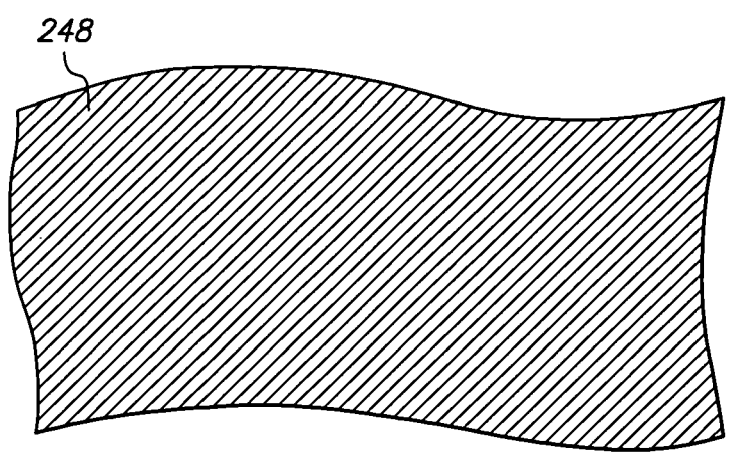
Figure 7B:
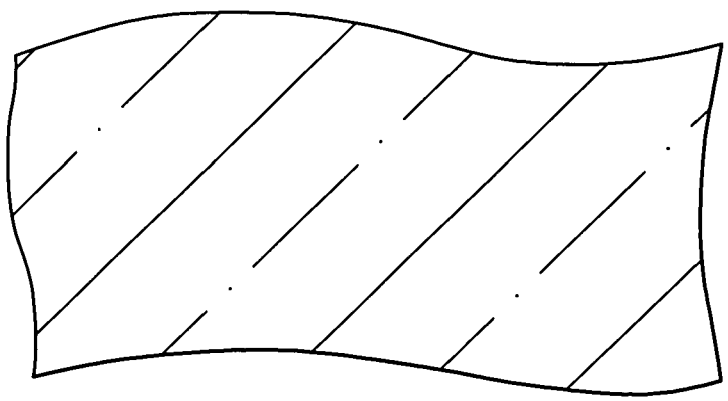
Figure 5C:
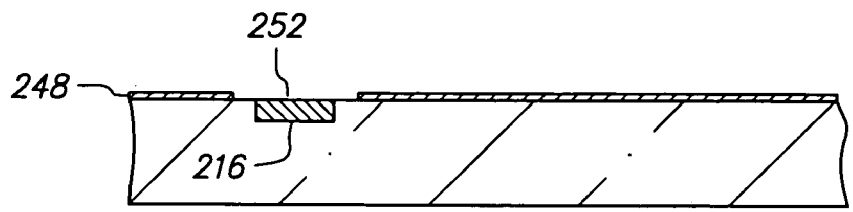
Figure 6C:
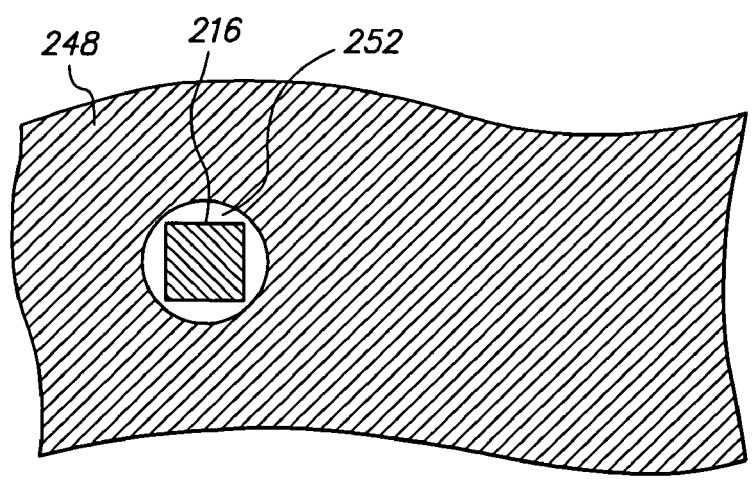
Figure 7C:
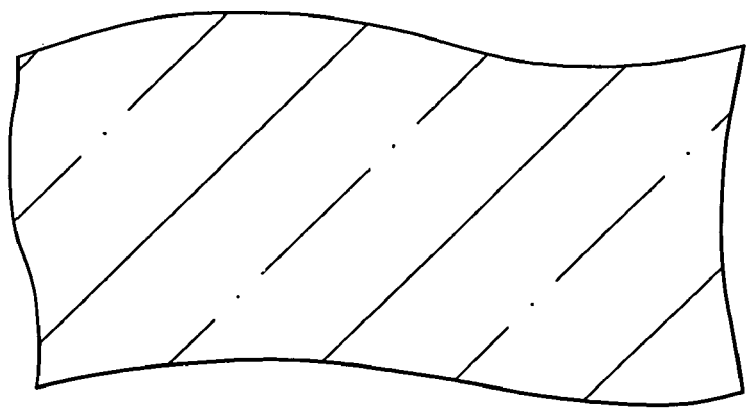
Figure 5D:
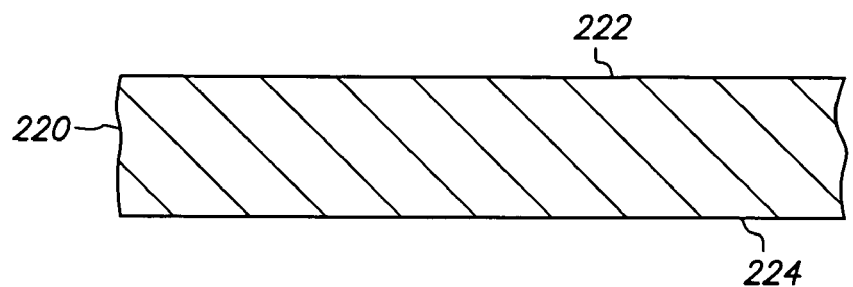
Figure 6D:
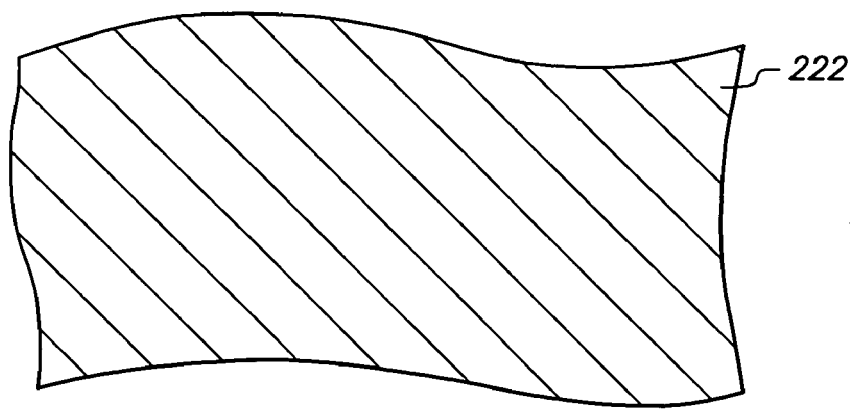
Figure 7D:
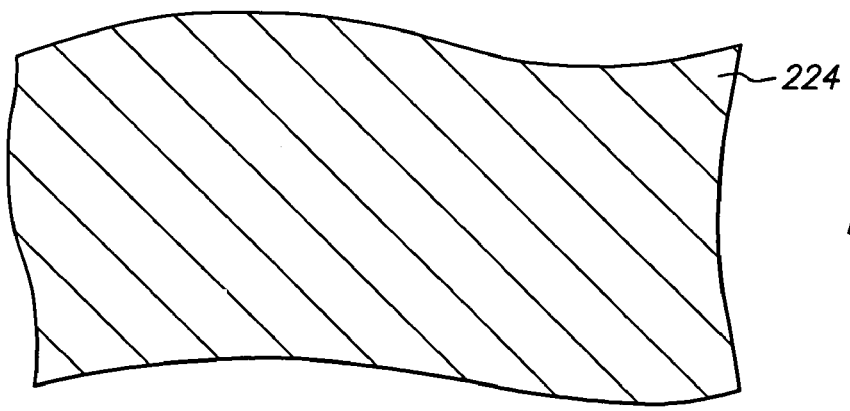
Figure 5E:
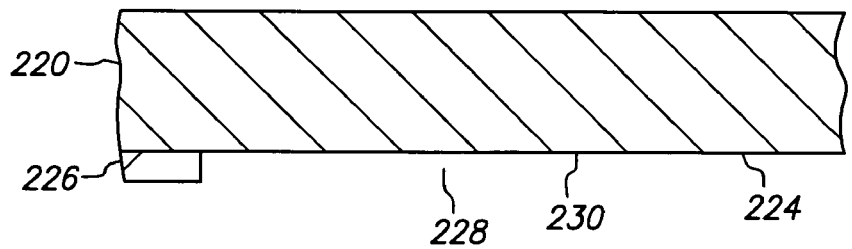
Figure 6E:
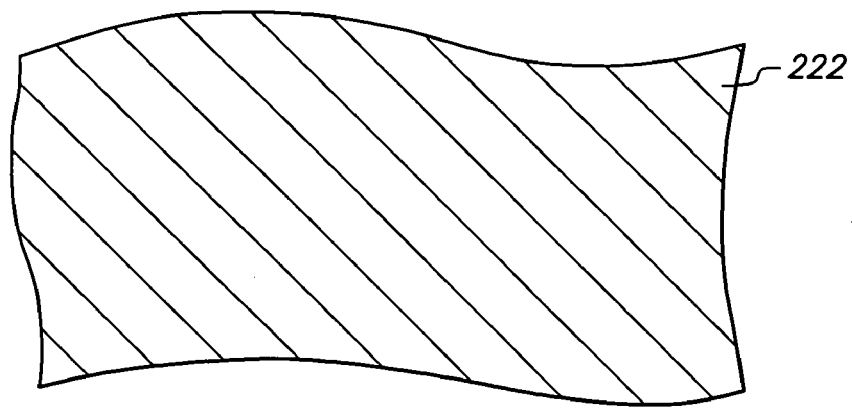
Figure 7E:
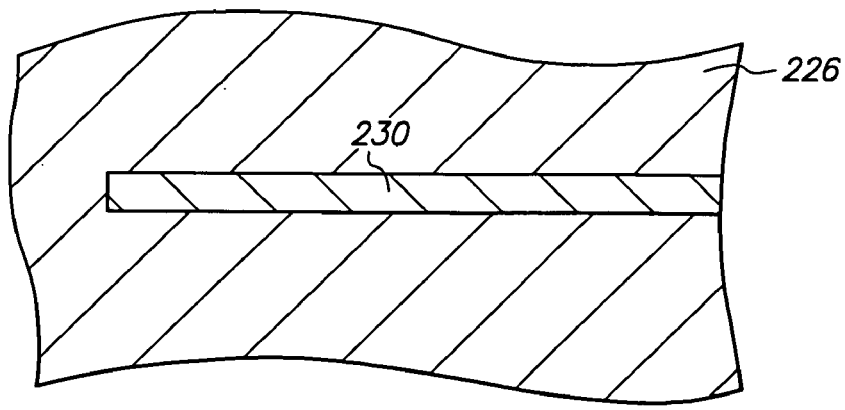
Figure 5F:
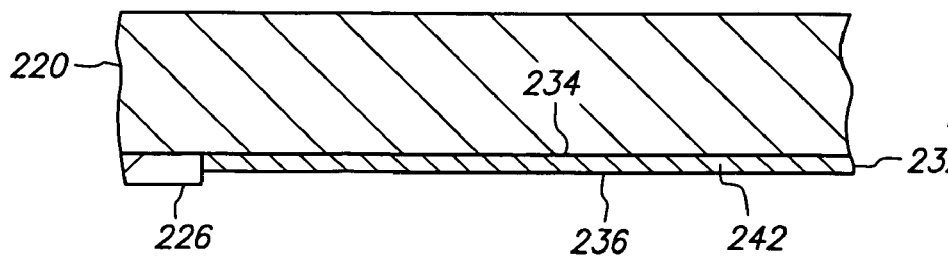
Figure 6F:
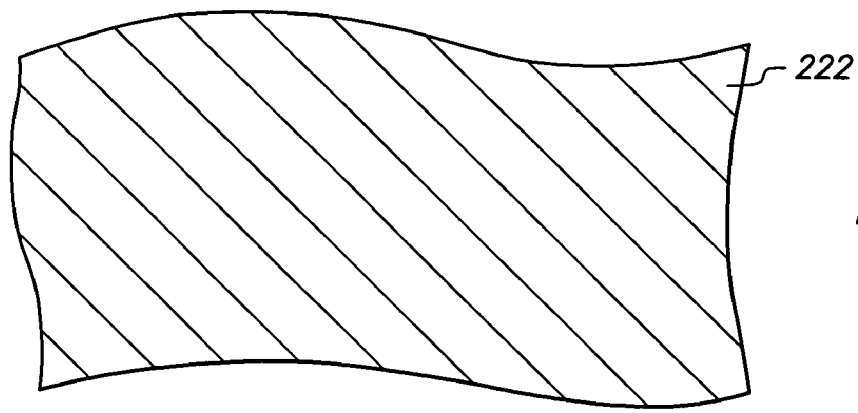
Figure 7F:
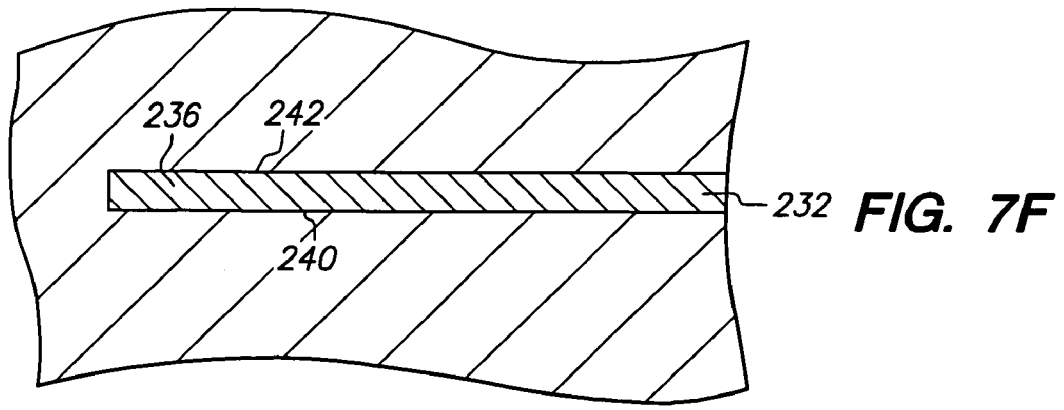
Figure 5G:
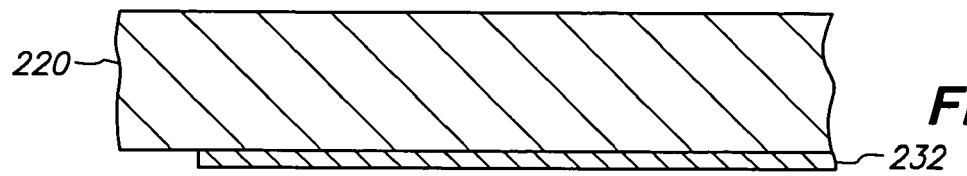
Figure 6G:
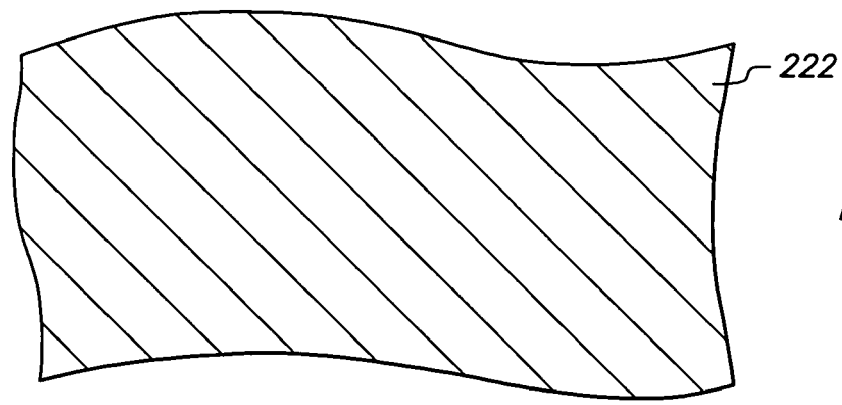
Figure 7G:
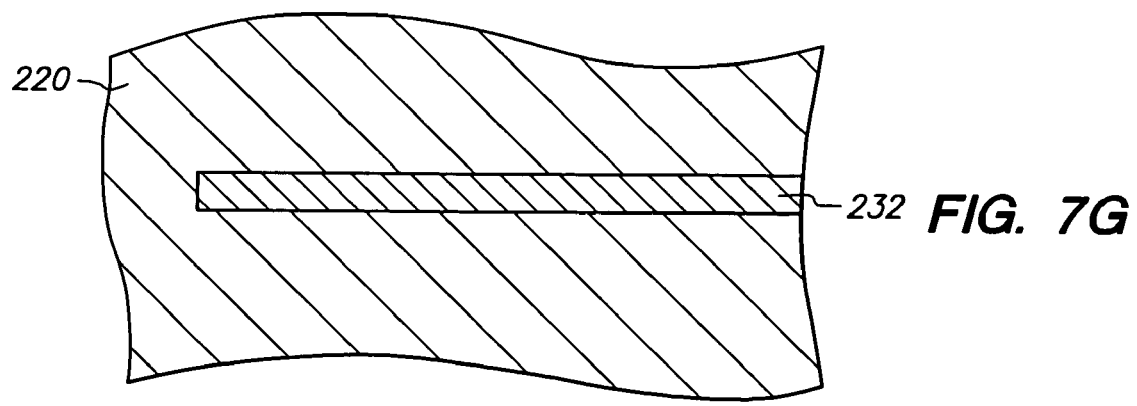
Figure 5H:
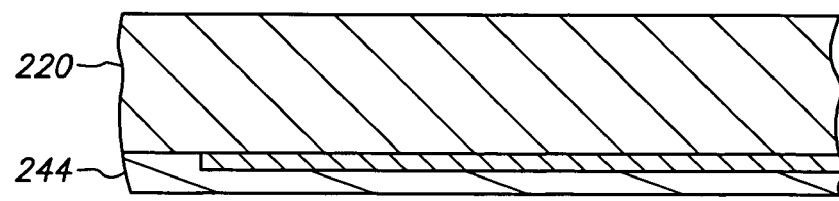
Figure 6H:
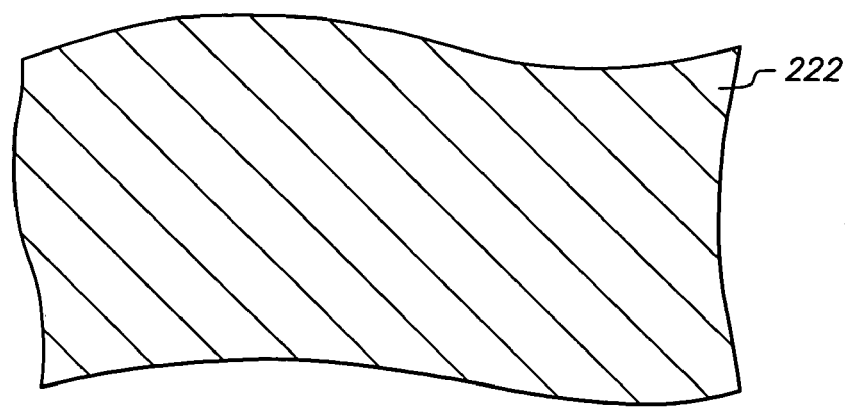
Figure 7H:
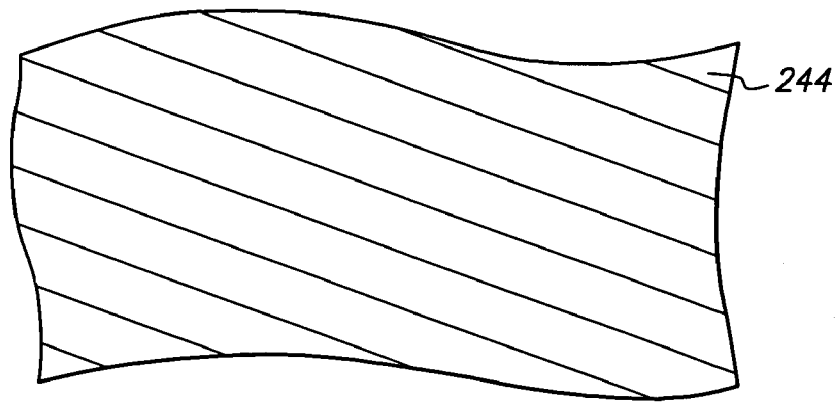
Figure 5I:
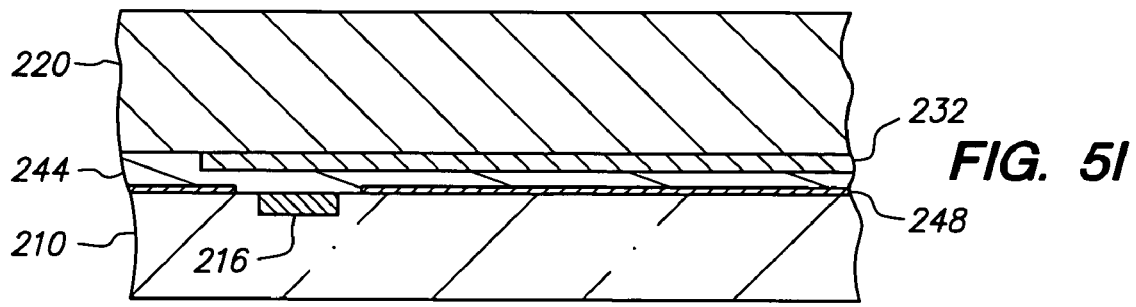
Figure 6I:
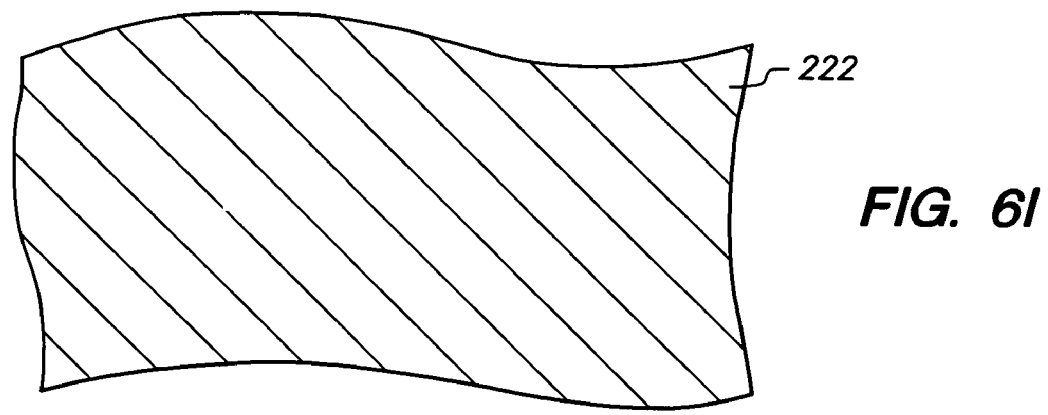
Figure 7I:
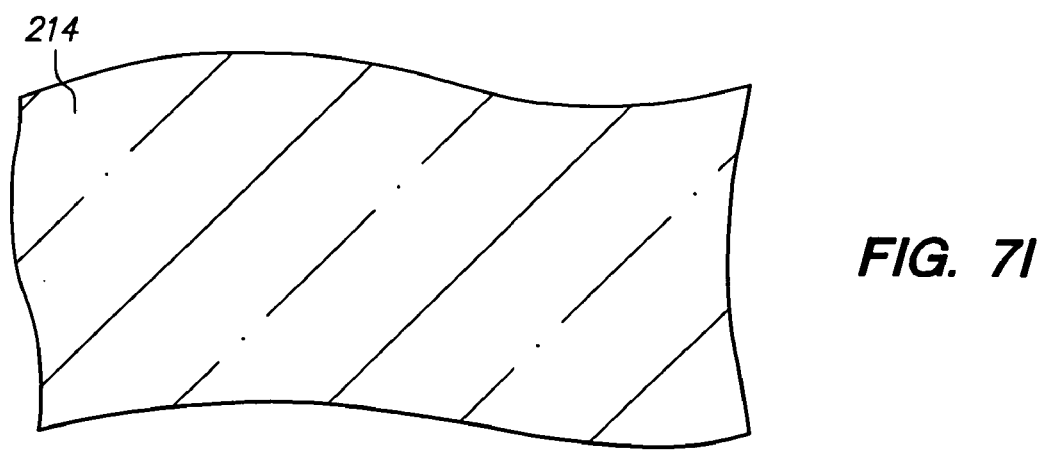
Figure 5J:
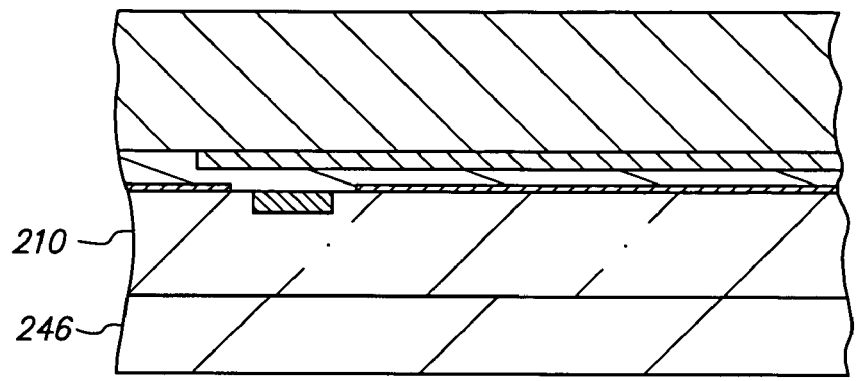
Figure 6J:
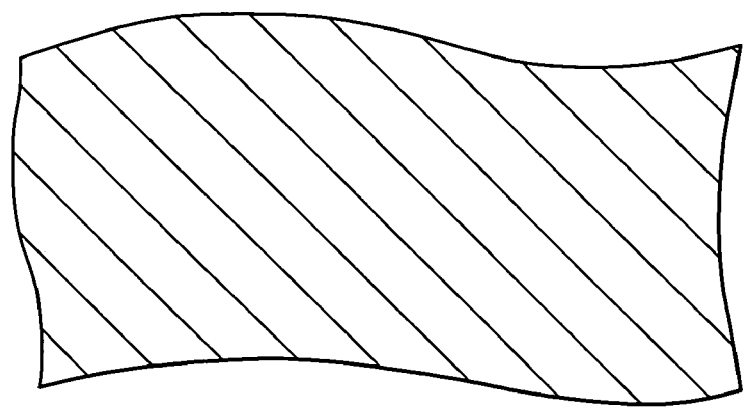
Figure 7J:
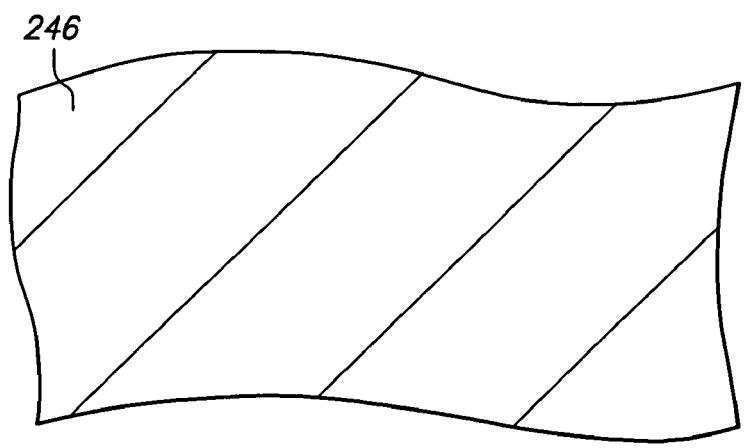
Figure 5K:
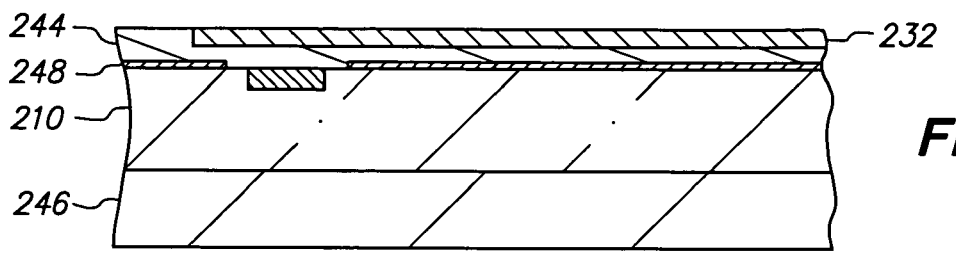
Figure 6K:
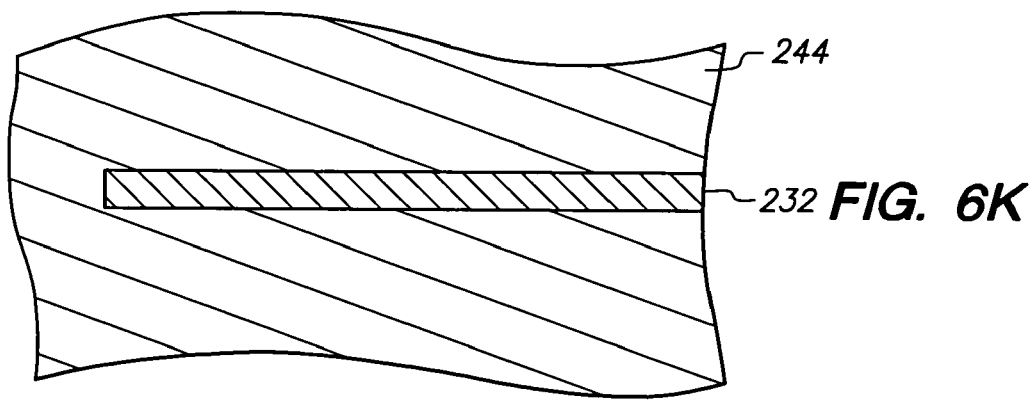
Figure 7K:
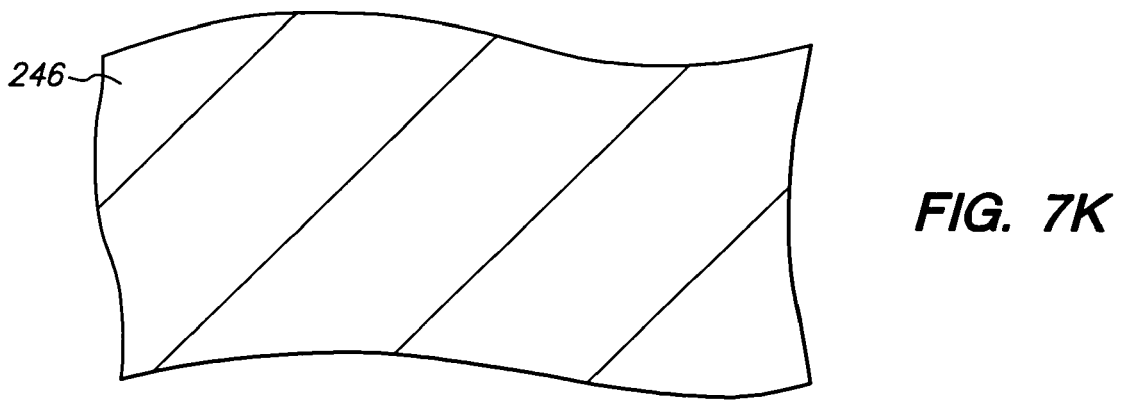
Figure 5L:
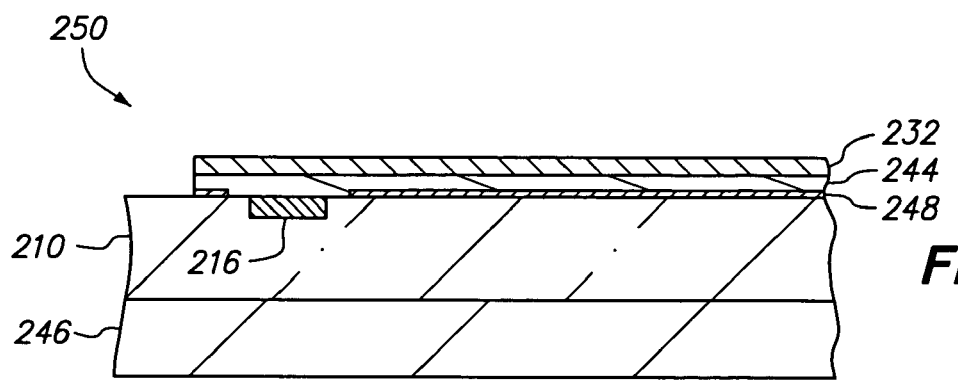
Figure 6L:
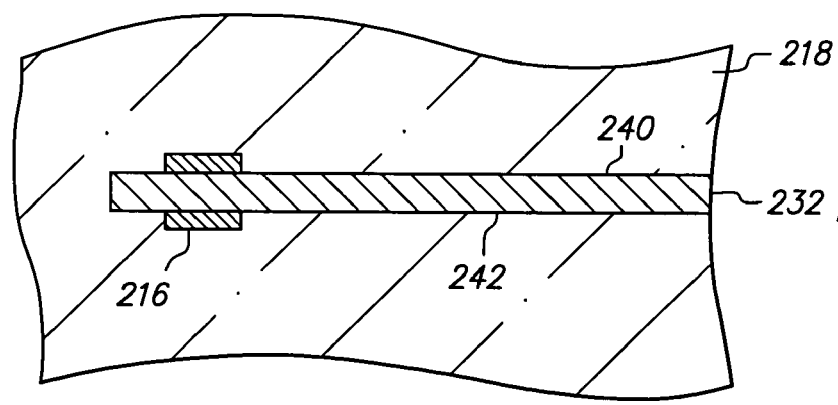
Figure 7L:
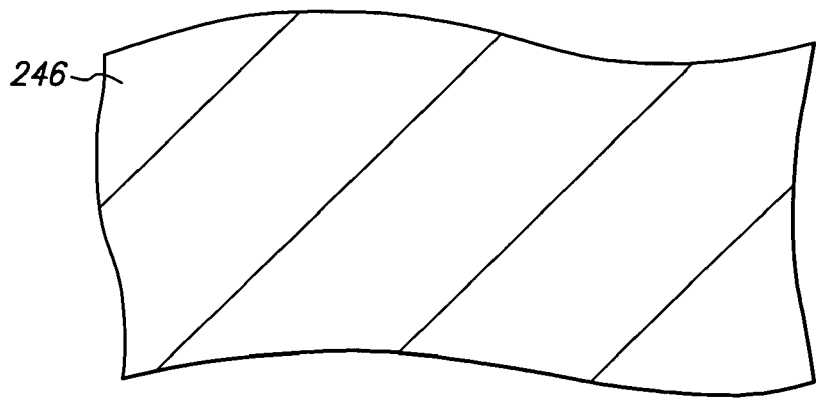
Figure 8A:
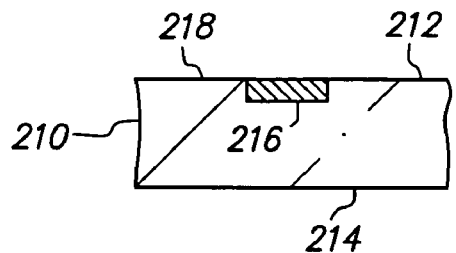
FIGS. 8A-8L are cross-sectional views corresponding to FIGS. 5A-5L, respectively.
Figure 8B:
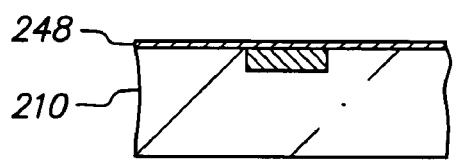
Figure 8C:
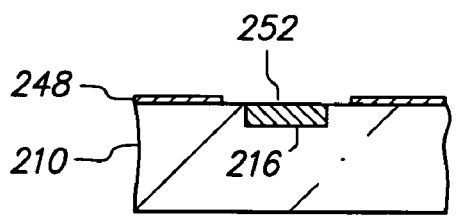
Figure 8D:
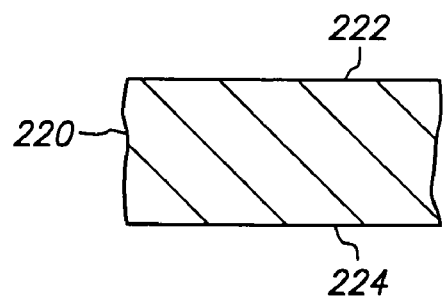
Figure 8E:
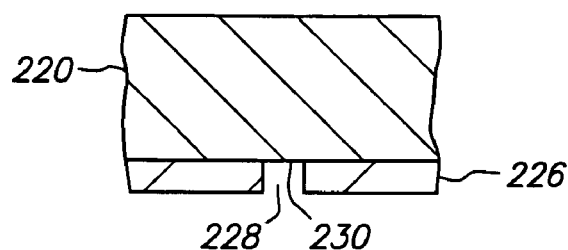
Figure 8F:
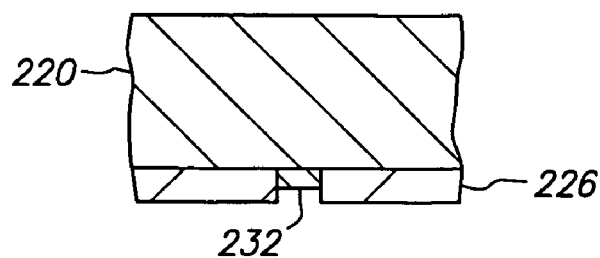
Figure 8G:
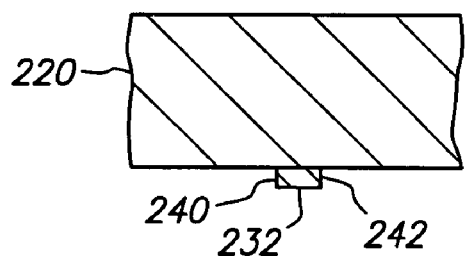
Figure 8H:
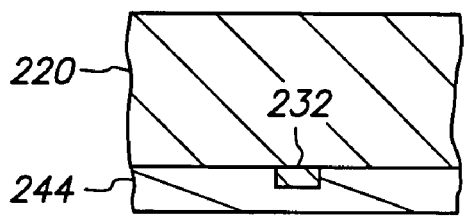
Figure 8I:
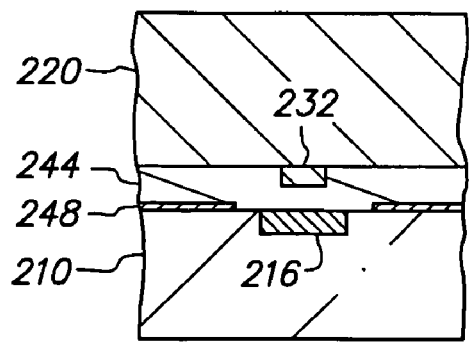
Figure 8J:
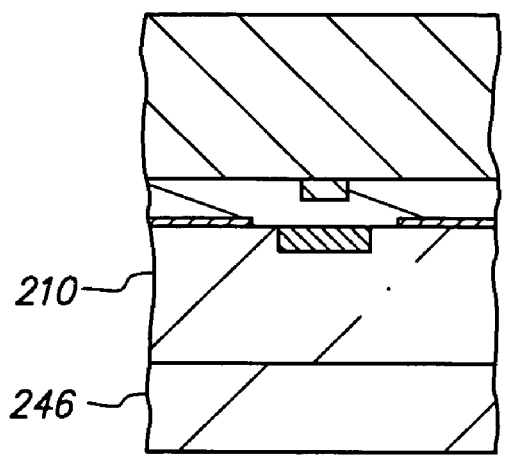
Figure 8K:
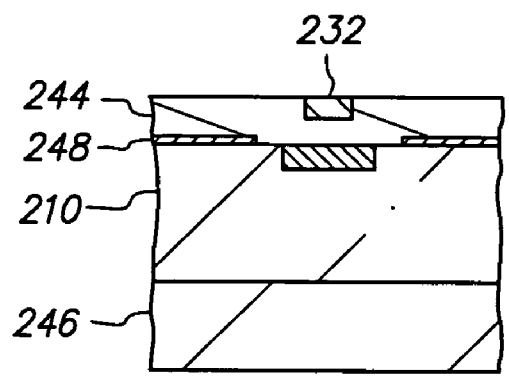
Figure 8L:
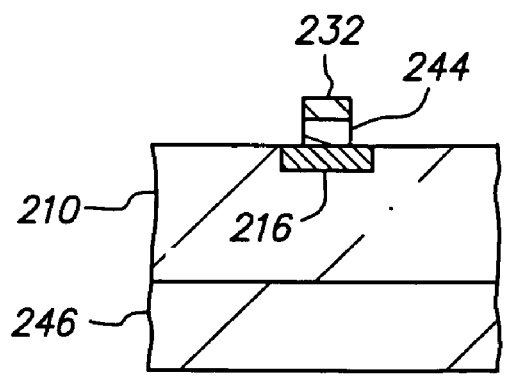

FIGS. 1A-1J, 2A-2J, 3A-3J and 4A-4J are cross-sectional, top, bottom and cross-sectional views, respectively, of a method of connecting a conductive trace to a semiconductor chip in accordance with a first embodiment of the present invention. FIGS. 4A-4J are oriented orthogonally with respect to FIGS. 1A-1J and depict FIGS. 1A-1J as viewed from left-to-right.

FIGS. 1A, 2A, 3A and 4A are cross-sectional, top, bottom and cross-sectional views, respectively, of semiconductor chip 110 which is an integrated circuit in which various transistors, circuits, interconnect lines and the like are formed (not shown). Chip 110 includes upper surface 112 and lower surface 114. Upper surface 112 includes conductive pad 116 and passivation layer 118. Pad 116 is substantially aligned with passivation layer 118 so that upper surface 112 is essentially flat. Alternatively, if desired, pad 116 can extend above or be recessed below passivation layer 118. Pad 116 provides a bonding site to electrically couple chip 110 with external circuitry. Thus, pad 116 can be an input/output pad or a power/ground pad. Pad 116 has a length and width of 70 microns.

Pad 116 has an aluminum base that is cleaned by dipping chip 110 in a solution containing 0.05 M phosphoric acid at room temperature for 1 minute and then rinsed in distilled water.

Chip 110 includes many other pads on upper surface 112, and only pad 116 is shown for convenience of illustration. In addition, chip 110 has already been singulated from other chips that it was previously attached to on a wafer.

FIGS. 1B, 2B, 3B and 4B are cross-sectional, top, bottom and cross-sectional views, respectively, of metal base 120 which includes top surface 122 and bottom surface 124. Metal base 120 is a copper foil with a thickness of 200 microns.

FIGS. 1C, 2C, 3C and 4C are cross-sectional, top, bottom and cross-sectional views, respectively, of photoresist layer 126 formed on bottom surface 124 of metal base 120. Photoresist layer 126 is deposited as a continuous layer and then patterned by selectively applying light through a reticle (not shown), applying a developer solution to remove the photoresist portions rendered soluble by the light, and then hard baking, as is conventional. As a result, photoresist layer 126 contains opening 128 that selectively exposes portion 130 of bottom surface 124. Photoresist layer 126 has a thickness of 25 microns.

FIGS. 1D, 2D, 3D and 4D are cross-sectional, top, bottom and cross-sectional views, respectively, of conductive trace 132 formed on metal base 120. Conductive trace 132 includes top surface 134, bottom surface 136, and peripheral sidewalls 140 and 142 therebetween. Top surface 134 faces towards and contacts and is covered by metal base 120, bottom surface 136 faces away from metal base 120 and is exposed, and peripheral sidewalls 140 and 142 extend orthogonally from metal base 120 and are covered by photoresist layer 126. Conductive trace 132 includes a first nickel layer deposited on metal base 120, a copper layer deposited on the first nickel layer, a second nickel layer deposited on the copper layer, and a gold layer deposited on the second nickel layer. The first nickel layer is 1 micron thick, the copper layer is 10 microns thick, the second nickel layer is 1 micron thick, and the gold layer is 0.5 microns thick. Conductive trace 132 has a thickness of 12.5 microns and a width of 50 microns. For convenience of illustration, the first nickel layer, the copper layer, the second nickel layer and the gold layer are shown as a single layer.

Conductive trace 132 is formed by an electroplating operation. Thus, conductive trace 132 is formed additively on exposed portion 130 of bottom surface 124 of metal base 120. Initially, metal base 120 is connected to a plating bus (not shown), current is applied to the plating bus from an external power source, and the structure is submerged in an electrolytic nickel plating solution such as Technic Techni Nickel "S" at room temperature to electroplate the first nickel layer on metal base 120. Thereafter, the structure is removed from the electrolytic nickel plating solution and submerged in an electrolytic copper plating solution such as Sel-Rex CUBATH M™ at room temperature while current is applied to the plating bus to electroplate the copper layer on the first nickel layer. Thereafter, the structure is removed from the electrolytic copper plating solution and submerged in an electrolytic nickel plating solution such as Technic Techni Nickel "S" at room temperature while current is applied to the plating bus to electroplate the second nickel layer on the copper layer. Thereafter, the structure is removed from the electrolytic nickel plating solution and submerged in an electrolytic gold plating solution such as Technic Orotemp at room temperature while current is applied to the plating bus to electroplate the gold layer on the second nickel layer. Thereafter, the structure is removed from the electrolytic gold plating solution and rinsed in distilled water to remove contaminants.

FIGS. 1E, 2E, 3E and 4E are cross-sectional, top, bottom and cross-sectional views, respectively, of metal base 120 and conductive trace 132 after photoresist layer 126 is stripped. Photoresist layer 126 is removed using a solvent, such as a mild alkaline solution with a pH of 9, that is highly selective of photoresist with respect to copper, nickel and gold. Therefore, no appreciable amount of metal base 120 or conductive trace 132 is removed. At this stage, conductive trace 132 remains attached to metal base 120, top surface 134 remains covered by metal base 120, and bottom surface 136 and peripheral sidewalls 140 and 142 are exposed.

FIGS. 1F, 2F, 3F and 4F are cross-sectional, top, bottom and cross-sectional views, respectively, of conductive adhesive 144 formed on metal base 120 and conductive trace 132. Conductive adhesive 144 is deposited as a conductive epoxy paste on portions of bottom surface 124 of metal base 120 and bottom surface 136 of conductive trace 132 using stencil printing. The conductive epoxy paste is compliant enough at room temperature to conform to virtually any shape. As a result, the conductive epoxy paste contacts peripheral sidewalls 140 and 142 and extends to but does not contact top surface 134. The conductive epoxy paste includes an epoxy binder and silver powder. The silver powder has an average particle size of 10 microns.

For convenience of illustration, conductive adhesive 144 is shown below metal base 120 to retain a single orientation throughout the figures for ease of comparison between the figures, although in this step the structure would be inverted so that gravitational force would assist with dispensing the conductive epoxy paste.

FIGS. 1G, 2G, 3G and 4G are cross-sectional, top, bottom and cross-sectional views, respectively, of chip 110 mechanically attached to conductive trace 132 and pad 116 electrically connected to conductive trace 132 by conductive adhesive 144. Conductive adhesive 144 is disposed between and contacts upper surface 112 of chip 110 and bottom surface 124 of metal base 120, and likewise, conductive adhesive 144 is disposed between and contacts upper surface 112 of chip 110 and bottom surface 136 of conductive trace 132. Thus, chip 110 and metal base 120 do not contact one another, and chip 110 and conductive trace 132 do not contact one another.

Preferably, conductive adhesive 144 is sandwiched between upper surface 112 and bottom surface 124, and between upper surface 112 and bottom surface 136, using relatively low pressure while conductive adhesive 144 is a conductive epoxy paste. In addition, chip 110 and conductive trace 132 are positioned relative to one another so that conductive trace 132 is disposed above and overlaps pad 116. In particular, conductive trace 132 overlaps the center of pad 116 and two opposing peripheral edges of pad 116 (but not the other two opposing peripheral edges of pad 116), and peripheral sidewalls 140 and 142 overlap pad 116. Chip 110 and conductive trace 132 can be aligned using an automated pattern recognition system. Thereafter, conductive adhesive 144 is fully cured at relatively low temperature in the range of 100 to 250° C. to form a solid conductive adhesive layer that is 15 microns thick between upper surface 112 and bottom surface 136. Conductive adhesive 144 mechanically fastens chip 110 to conductive trace 132 and electrically connects pad 116 to conductive trace 132.

At this stage, conductive trace 132 is covered from above by metal base 120 and covered from below by conductive adhesive 144, peripheral sidewalls 140 and 142 are covered by conductive adhesive 144, pad 116 is covered from above by conductive adhesive 144, and pad 116 is separated from conductive trace 132 by the thickness of conductive adhesive 144. In addition, conductive adhesive 144 contacts metal base 120 and is coplanar with and adjacent to but does not contact top surface 134.

FIGS. 1H, 2H, 3H and 4H are cross-sectional, top, bottom and cross-sectional views, respectively, of encapsulant 146 formed on lower surface 114 of chip 110. Encapsulant 146 is initially an insulative epoxy paste that includes an epoxy resin, a curing agent, an accelerator and a filler. The filler is an inert material such as silica (powdered fused quartz) that provides thermal coefficient of expansion matching. Thereafter, the insulative epoxy paste is cured or hardened at relatively low temperature in the range of 100 to 250° C. to form a solid adherent insulative protective layer. Encapsulant 146 provides back-side environmental protection such as moisture resistance and particle protection for chip 110 and has a thickness of 100 microns.

FIGS. 1I, 2I, 3I and 4I are cross-sectional, top, bottom and cross-sectional views, respectively, of chip 110, conductive trace 132, conductive adhesive 144 and encapsulant 146 after metal base 120 is removed. A "front-side" wet chemical etch is applied to top surface 122 of metal base 120. For instance, the wet chemical etch can be sprayed on top surface 122, or the structure can be dipped in the wet chemical etch since chip 110 is protected by encapsulant 146. The wet chemical etch is highly selective of copper with respect to nickel, silver and epoxy. In addition, the copper layer of conductive trace 132 is protected from the wet chemical etch by the first nickel layer of conductive trace 132 and conductive adhesive 144. Therefore, no appreciable amount of conductive trace 132, conductive adhesive 144 or encapsulant 146 is removed. A suitable wet chemical etch can be provided by a solution containing alkaline ammonia. The optimal etch time for exposing metal base 120 to the wet chemical etch in order to completely remove metal base 120 without excessively exposing the nickel surface layer of conductive trace 132 to the wet chemical etch can be established through trial and error.

The wet chemical etch completely removes metal base 120, thereby exposing conductive trace 132 and conductive adhesive 144. At this stage, conductive adhesive 144 continues to contact and cover pad 116, bottom surface 136 and peripheral sidewalls 140 and 142 and provides critical mechanical support for conductive trace 132. In addition, conductive adhesive 144 is coplanar with and adjacent to but does not contact top surface 134.

FIGS. 1J, 2J, 3J and 4J are cross-sectional, top, bottom and cross-sectional views, respectively, of the structure after a portion of conductive adhesive 144 is removed, thereby exposing pad 116, passivation layer 118 and peripheral sidewalls 140 and 142 while conductive adhesive 144 remains in contact with and sandwiched between pad 116 and conductive trace 132. The portion of conductive adhesive 144 can be removed by applying a suitable removal technique that is highly selective of conductive adhesive 144 with respect to pad 116 and conductive trace 132.

In this instance, a blanket oxygen plasma etch is applied using conductive trace 132 as an etch mask and then air blowing is applied. The plasma etch attacks and removes the exposed epoxy binder of conductive adhesive 144 and loosens the silver powder of conductive adhesive 144 that was previously secured by the exposed epoxy binder, and the air blowing mechanically displaces and removes the loosened silver powder of conductive adhesive 144.

The plasma etch and air blowing remove a portion of conductive adhesive 144 outside conductive trace 132. That is, conductive trace 132 shields the underlying conductive adhesive 144 from the plasma etch and air blowing so that conductive adhesive 144 remains in contact with and sandwiched between pad 116 and conductive trace 132. The plasma etch and air blowing remove a portion of conductive adhesive 144 that is above pad 116 and adjacent to peripheral sidewalls 140 and 142. In addition, the plasma etch is anisotropic but includes an isotropic component, and as a result, a slight portion of conductive adhesive 144 sandwiched between pad 116 and conductive trace 132 and beneath peripheral sidewalls 140 and 142 is undercut or removed. The plasma etch and air blowing remove the portion of conductive adhesive 144 without damaging pad 116, passivation layer 118 or conductive trace 132.

Plasma etching of polymers to form microvias in printed circuit boards, high density interconnects and multichip modules is well-known in the art. Generally speaking, a simple plasma reactor contains two plate electrodes and a low pressure chamber. The electrodes are connected to a high frequency voltage source so that a current flows forming a plasma which emits a characteristic glow, and reactive radicals are generated by this discharge. The reactive radicals react with the polymer to form volatile products that evaporate to etch the polymer and the end products are pumped away and evacuated.

Radio frequency discharge can etch a polymer exposed to the plasma. The diffusion of charged particles (positive ions and electrons) to the walls and their recombination leads to the formation of a sheath, a boundary layer near surfaces and walls of depleted charges. Electrons diffuse faster than positive ions due to their light weight and high energy, leaving a positive plasma potential relative to the walls. Positive ions are accelerated through the sheath and strike the walls at near-normal incidence. This operational etching mode in which ion bombardment provides directional etching is known as reactive ion etching (RIE). In addition, chemically reactive neutral radicals travelling independent of the accelerating field cause isotropic etching. The degree of isotropy is influenced by process conditions. For instance, increasing the operating pressure in a reactive ion etching plasma with oxygen increases the density of reactive oxygen atoms which increases the isotropic etching.

To elaborate, reactive neutral radicals move in all directions and form isotropic profiles without directional preference, whereas positively charged ions are accelerated vertically towards the electrode and form anisotropic profiles with vertical directional preference. As a result, concentration differences between reactive neutral radicals and positive ions changes the profile formation. High reactive neutral radical concentrations result in isotropic profiles, whereas high positive ion concentrations result in anisotropic profiles.

The optimal plasma etching parameters, such as the power level, excitation frequency, electrode structure, plasma-forming gas, pressure, flow rate and exposure time, in order to remove the portion of conductive adhesive 144 outside conductive trace 132 without excessively etching or degrading the portion of conductive adhesive 144 beneath conductive trace 132, which remains intact and contacts and is sandwiched between chip 110 and conductive trace 132, or damaging chip 110, can be established through trial and error.

Preferably, the plasma is an RF discharge applied in a low pressure chamber between 0.001 to 1 Torr. The excitation frequency can be between 40 KHz to 100 MHz, with 13.56 MHz a commonly employed ISM frequency allocated by radio communications authorities for industrial process equipment. The plasma-forming gas is preferably an oxygen-containing gas that attacks polymers to form CO, $CO_2$ and $H_2O$ as the final end products. For example, the plasma-forming gas can be pure oxygen or 10-20% $CF_4$ and 70-80% $O_2$. The plasma-forming gas can also include an oxygen-containing gas mixed with a fluorine-containing gas such as $CF_4$ or $C_2F_6$ to increase the etch rate. This occurs because the fluorine atoms extract hydrogen from the polymer to form HF, which produces sites that react more rapidly with molecular oxygen. The plasma-forming gas can also include an oxygen-containing gas mixed with an inert gas such as argon to stabilize the plasma. Preferably, the applied electric field converts the plasma-forming gas to a plasma which includes highly reactive species such as molecular oxygen or molecular oxygen and fluorine that isotropically etch polymer. In addition, the vacuum pump and gas supply source should be arranged to move the gasses through the chamber at a rate sufficient to remove the end products and limit redeposit of the end products back onto the structure. Advantageously, once the plasma etching parameters are established for a given application, the plasma etching tends to be highly controllable and repeatable, and the same conditions can be used repeatedly in volume manufacturing.

At this stage, the manufacture of semiconductor chip assembly 150 that includes chip 110, conductive trace 132, conductive adhesive 144 and encapsulant 146 can be considered complete. Conductive trace 132 is mechanically and electrically coupled to chip 110 by conductive adhesive 144. Advantageously, conductive trace 132 is a single continuous low-profile metal segment, conductive adhesive 144 is the only electrical conductor external to chip 110 that contacts pad 116, and conductive adhesive 144 is the only electrical conductor that contacts both pad 116 and conductive trace 132.

The semiconductor chip assembly includes other conductive traces attached to chip 110 by conductive adhesive 144, and only a single conductive trace 132 is shown for convenience of illustration. The conductive traces each overlap a respective pad on chip 110 and are electrically connected to the respective pad by conductive adhesive 144. The conductive traces are simultaneously formed on and electrically connected to one another by metal base 120 (at the step depicted in FIGS. 1D, 2D, 3D and 4D). Thereafter, conductive adhesive 144 contacts and electrically connects the conductive traces to one another and to respective pads on chip 110 (at the step depicted in FIGS. 1G, 2G, 3G and 4G). Thereafter, metal base 120 is etched so that metal base 120 no longer electrically connects the conductive traces to one another, however conductive adhesive 144 still electrically connects the conductive traces to one another and to respective pads on chip 110 (at the step depicted in FIGS. 1I, 2I, 3I and 4I). Thereafter, the portion of conductive adhesive 144 is removed so that conductive adhesive 144 no longer electrically connects the conductive traces to one another, and consequently the conductive traces become electrically isolated from one another, however conductive adhesive 144 still electrically connects the conductive traces to respective pads on chip 110 (at the step depicted in FIGS. 1J, 2J, 3J and 4J).

Advantageously, since metal base 120 provides a plating bus for forming the conductive traces, and conductive adhesive 144 provides the connection joints that electrically connect the conductive traces to the pads, there is no plating bus or related circuitry that need be disconnected or severed from chip 110 or the conductive traces after metal base 120 is removed.

FIGS. 5A-5L, 6A-6L, 7A-7L and 8A-8L are cross-sectional, top, bottom and cross-sectional views, respectively, of a method of connecting a conductive trace to a semiconductor chip in accordance with a second embodiment of the present invention. FIGS. 8A-8L are oriented orthogonally with respect to FIGS. 5A-5L and depict FIGS. 5A-5L as viewed from left-to-right. In the second embodiment, an insulative adhesive is formed on the chip, an opening is formed in the insulative adhesive that exposes the pad, and then the conductive adhesive is disposed between the conductive trace and the chip. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, chip 210 corresponds to chip 110, metal base 220 corresponds to metal base 120, etc.

FIGS. 5A, 6A, 7A and 8A are cross-sectional, top, bottom and cross-sectional views, respectively, of semiconductor chip 210 which includes upper surface 212 and lower surface 214. Upper surface 212 includes conductive pad 216 and passivation layer 218.

FIGS. 5B, 6B, 7B and 8B are cross-sectional, top, bottom and cross-sectional views, respectively, of insulative adhesive 248 formed on chip 210. Insulative adhesive 248 is an insulative thermosetting polyimide film. Insulative adhesive 248 is deposited on upper surface 212 of chip 210 as a liquid resin (A stage) such as polyamic acid using spin coating. Thereafter, the liquid resin is fully cured (C stage) at relatively low temperature in the range of 200 to 250° C. to form a solid adhesive insulative polyimide layer that is 2 microns thick.

FIGS. 5C, 6C, 7C and 8C are cross-sectional, top, bottom and cross-sectional views, respectively, of opening 252 formed in insulative adhesive 248 that exposes pad 216. Opening 252 can be provided by applying a suitable etch that is highly selective of insulative adhesive 248 with respect to pad 216.

In this instance, a selective TEA $CO_2$ laser etch is applied. Using projection laser ablation, a metal mask (not shown) is positioned above upper surface 212 such that an opening in the metal mask is aligned with pad 216, and a laser is directed to the side of the metal mask opposite upper surface 212. Accordingly, the metal mask targets the laser at pad 216. The laser removes a portion of insulative adhesive 248 above pad 216 and slightly outside the periphery of pad 216.

Opening 252 has a diameter of 100 microns and pad 216 (with a length and width of 70 microns) is axially centered within opening 252. Opening 252 is formed in insulative adhesive 248 without damaging pad 216 or passivation layer 218.

FIGS. 5D, 6D, 7D and 8D are cross-sectional, top, bottom and cross-sectional views, respectively, of metal base 220 which includes top surface 222 and bottom surface 224.

FIGS. 5E, 6E, 7E and 8E are cross-sectional, top, bottom and cross-sectional views, respectively, of photoresist layer 226 formed on bottom surface 224 of metal base 220.

Photoresist layer 226 contains opening 228 that selectively exposes portion 230 of bottom surface 224.

FIGS. 5F, 6F, 7F and 8F are cross-sectional, top, bottom and cross-sectional views, respectively, of conductive trace 232 formed on metal base 220 by electroplating. Conductive trace 232 includes top surface 234, bottom surface 236 and peripheral sidewalls 240 and 242.

FIGS. 5G, 6G, 7G and 8G are cross-sectional, top, bottom and cross-sectional views, respectively, of metal base 220 and conductive trace 232 after photoresist layer 226 is stripped.

FIGS. 5H, 6H, 7H and 8H are cross-sectional, top, bottom and cross-sectional views, respectively, of conductive adhesive 244 deposited on metal base 220 and conductive trace 232 as a conductive epoxy paste.

FIGS. 5I, 6I, 7I and 8I are cross-sectional, top, bottom and cross-sectional views, respectively, of chip 210 mechanically attached to conductive trace 232 and pad 216 electrically connected to conductive trace 232 by conductive adhesive 244. Chip 210 and conductive trace 232 are positioned relative to one another so that conductive trace 232 is disposed above and overlaps pad 216 and opening 252. In addition, conductive adhesive 244 fills opening 252. Thus, conductive adhesive 244 contacts and is sandwiched between conductive trace 232 and insulative adhesive 248 outside opening 252, and conductive adhesive 244 contacts and is sandwiched between pad 216 and conductive trace 232 inside opening 252. Likewise, insulative adhesive 248 contacts and is sandwiched between chip 210 and conducive adhesive 244, and insulative adhesive 248 is spaced from metal base 220 and conductive trace 232.

FIGS. 5J, 6J, 7J and 8J are cross-sectional, top, bottom and cross-sectional views, respectively, of encapsulant 246 formed on chip 210.

FIGS. 5K, 6K, 7K and 8K are cross-sectional, top, bottom and cross-sectional views, respectively, of chip 210, conductive trace 232, conductive adhesive 244, encapsulant 246 and insulative adhesive 248 after metal base 220 is removed by wet chemical etching.

FIGS. 5L, 6L, 7L and 8L are cross-sectional, top, bottom and cross-sectional views, respectively, of the structure after portions of conductive adhesive 244 and insulative adhesive 248 are removed, thereby exposing pad 216, passivation layer 218 and peripheral sidewalls 240 and 242 while conductive adhesive 244 remains in contact with and sandwiched between pad 216 and conductive trace 232. In this instance, a blanket oxygen plasma etch is applied using conductive trace 232 as an etch mask and then air blowing is applied. The plasma etch attacks and removes the exposed epoxy binder of conductive adhesive 244 and the underlying portion of insulative adhesive 248 and loosens the silver powder of conductive adhesive 244 that was previously secured by the exposed epoxy binder, and the air blowing mechanically displaces and removes the loosened silver powder of conductive adhesive 244. Advantageously, the plasma etch removes the portion of insulative adhesive 248 that underlies the loosened silver powder, thereby further loosening the silver powder and facilitating the removal of the loosened silver powder by the air blowing.

At this stage, the manufacture of semiconductor chip assembly 250 that includes chip 210, conductive trace 232, conductive adhesive 244, encapsulant 246 and insulative adhesive 248 can be considered complete.

The semiconductor chip assemblies described above are merely exemplary. Numerous other embodiments are contemplated.

Figure 9:
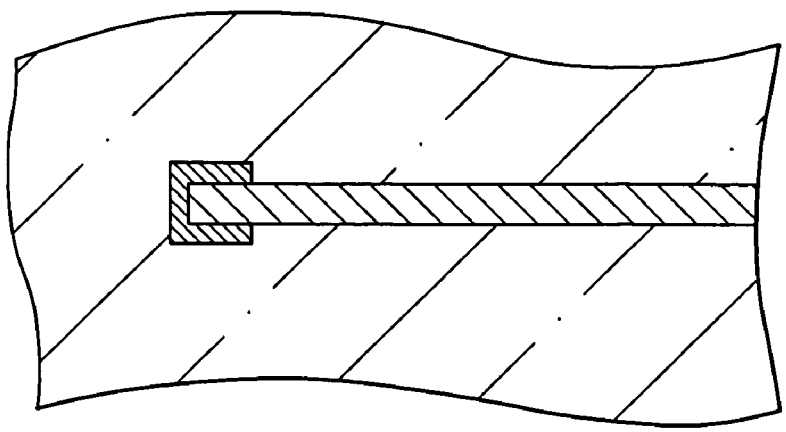
FIGS. 9-13 are top plan views of conductive trace variations in accordance with the present invention.
Figure 10:
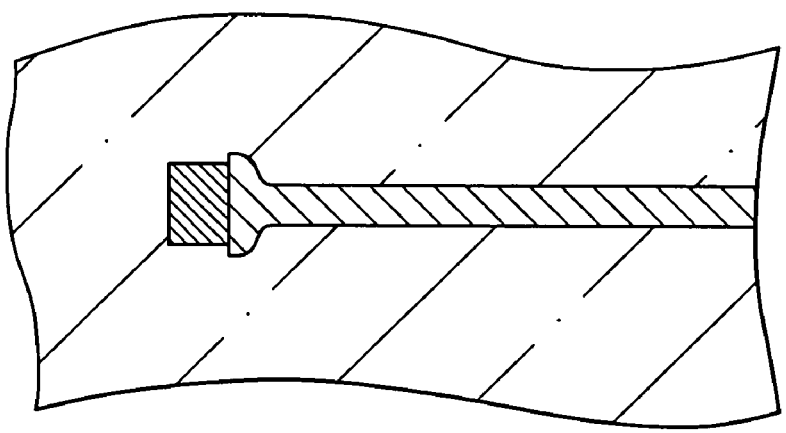
Figure 11:
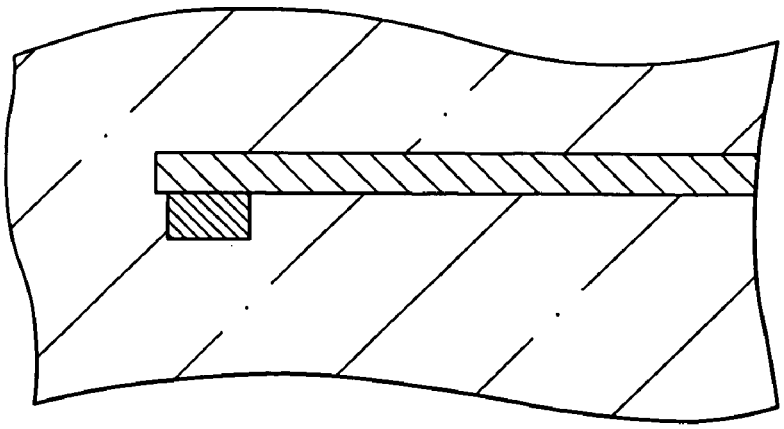
Figure 12:
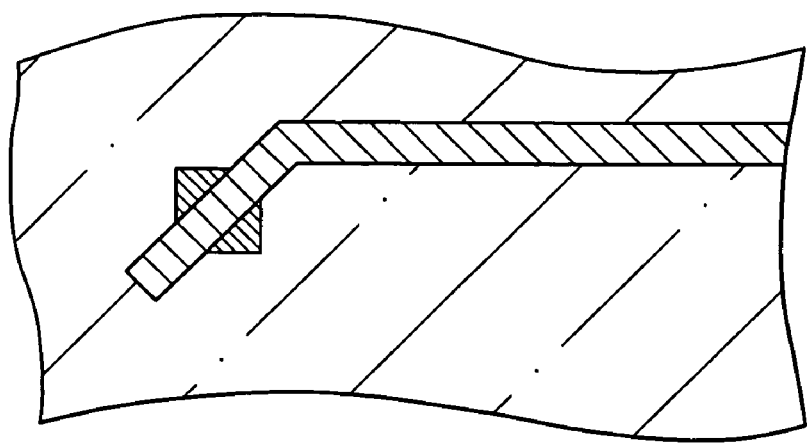
Figure 13:
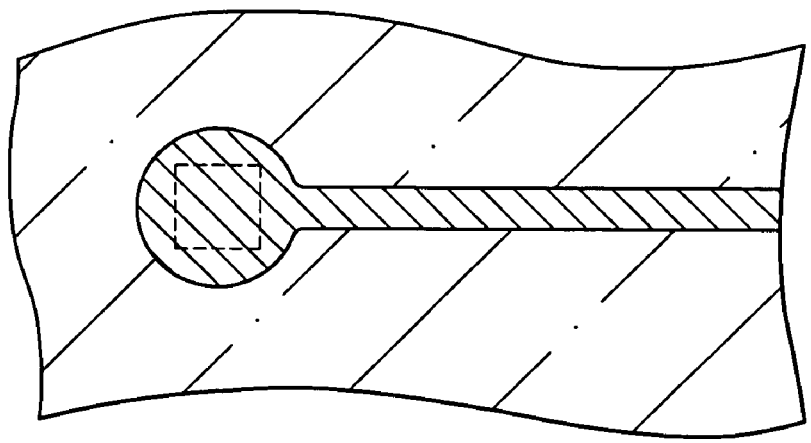

The conductive trace can have various shapes and sizes. The conductive trace can overlap various portions of the pad, such as two opposing peripheral edges and the center of the pad (FIGS. 2J and 6L), one peripheral edge and the center of the pad (FIG. 9), three peripheral edges but not the center of the pad (FIGS. 10 and 11), two corners and the center of the pad (FIG. 12) or the entire pad (FIG. 13).

The conductive trace can be various conductive metals including copper, gold, nickel, silver, palladium, tin, combinations thereof, and alloys thereof. The preferred composition of the conductive trace will depend on design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper).

The conductive trace may function as a signal, power or ground layer depending on the purpose of the associated chip pad. Likewise, the conductive trace can fan-in or fan-out or both.

The conductive trace can be formed on the metal base by numerous deposition techniques including electroplating and electroless plating.

The conductive trace can be deposited as a single layer or multiple layers. For instance, the conductive trace can be a 5 micron layer of gold, or alternatively, a 4.5 micron layer of nickel electroplated on a 0.5 micron layer of gold electroplated on a copper base to reduce costs, or alternatively, a 4 micron layer of nickel electroplated on a 0.5 micron layer of gold electroplated on a 0.5 micron layer of tin electroplated on a copper base to reduce costs and avoid gold-copper alloys that may be difficult to remove when the copper base is etched.

As another example, the conductive trace can consist of a non-copper layer electroplated on a copper base and a copper layer electroplated on the non-copper layer. Suitable non-copper layers include nickel, gold, palladium and silver. After the conductive trace is attached to the chip by the conductive adhesive, a wet chemical etch can be applied that is highly selective of copper with respect to the non-copper layer to remove the copper base (or the exposed portion of the copper base) without removing the copper or non-copper layers. The non-copper layer provides an etch stop that prevents the wet chemical etch from removing the copper layer. Furthermore, it is understood that in the context of the present invention, the conductive trace and the metal base are different metals (or metallic materials) even if a multi-layer conductive trace includes a single layer that is similar to the metal base (such as the example described above).

The conductive trace need not necessarily be flat, and a vertically protruding ball, pad, pillar (columnar post), bumped terminal or contact terminal can be deposited on or subtractively formed from the conductive trace. A pillar is particularly well-suited for reducing thermal mismatch related stress in the next level assembly, and a bumped terminal is particularly well-suited for providing vertical compliance in the next level assembly. Further details regarding conductive traces with various pillars and bumped terminals are set forth in U.S. application Ser. No. 09/878,649 filed Jun. 11, 2001 by Charles W. C. Lin entitled "Method of Making a Semiconductor Chip Assembly with a Conductive Trace Subtractively Formed Before and After Chip Attachment," U.S. application Ser. No. 09/878,626 filed Jun. 11, 2001 by Charles W. C. Lin entitled "Method of Connecting a Conductive Trace to a Semiconductor Chip,"

and U.S. application Ser. No. 09/997,973 filed Nov. 29, 2001 by Charles W. C. Lin et al. entitled "Method of Connecting a Bumped Conductive Trace to a Semiconductor Chip" which are incorporated by reference.

The conductive trace can be formed and attached to the chip by a wide variety of lead-on-chip (LOC) and other connection techniques. See, for instance, the U.S. Applications mentioned in the preceding paragraph.

The metal base can be various metals including copper, copper alloys, iron-nickel alloys, aluminum, and so on.

The metal base need not necessarily be removed. For instance, a portion of the metal base above the chip can be selectively etched to permit removing the portion of the conductive adhesive, and another portion of the metal base that is disposed within the periphery of the chip and spaced from the conductive trace can remain intact and provide a heat sink, and/or another portion of the metal base that is disposed either within or outside the periphery of the chip and contacts the conductive trace can remain intact and provide a pillar. Alternatively, the metal base can be omitted.

The pad can have numerous shapes including a flat rectangular shape and a bumped shape. For instance, a bump-shaped pad may extend into the opening in the insulative adhesive. The pad can have a length and width that are larger than, equal to, or smaller than the diameter of the opening in the insulative adhesive. Preferably, the pad and opening have the same or similar size, and essentially all of the pad is directly beneath the opening. If desired, the pad can be treated to better accommodate the conductive adhesive. For instance, the pad can be further fabricated by depositing several metal layers, such as chromium/copper/gold or titanium/nickel/gold on the aluminum base, or alternatively, zincating the aluminum base and electrolessly plating a nickel surface layer on the zincated aluminum base.

The conductive adhesive can include (1) a polymer binder (or matrix) and a filler metal powder, or (2) intrinsic conductive polymer. Suitable polymer binders include epoxy, polyimide and silicone. Suitable filler metal powders include silver, copper, nickel and graphite. Isotropic conductive adhesives in which the electrical conductivity is identical along the three coordinate axes are generally preferred.

The conductive adhesive can be disposed between the conductive trace and the pad by depositing a non-solidified conductive adhesive initially on the conductive trace, the chip or both, then sandwiching the conductive adhesive between the conductive trace and the chip, and then applying energy to cure the conductive adhesive and form a hardened conductive layer. Suitable deposition processes include screen printing and stencil printing. Heat can be supplied by a convection oven, although other energy sources such as microwaves and UV light can be used. The preferred deposition and curing techniques depend on the conductive adhesive employed.

The portion of the conductive adhesive that is removed can be removed by numerous techniques. Similarly, the portion of the conductive adhesive can be removed by a single removal step or multiple removal steps. For instance, the portion of the conductive adhesive can be removed by applying an etch that attacks a polymer binder of the conductive adhesive and then applying displacement to a filler metal powder of the conductive adhesive. The etch need not appreciably affect the filler metal powder, and the displacement need not appreciably affect the polymer binder. The etch can be provided by a plasma that chemically reacts with the polymer binder, a laser that ablates the polymer binder, or a wet chemical etchant that dissolves the polymer binder. The etch can be blanket, for example using the conductive trace as an etch mask, or selective, for example using a metal mask that is spaced from or removably attached to the structure. The etch can be anisotropic, such as an anisotropic plasma etch or laser ablation, or isotropic, such as an isotropic plasma etch or a wet chemical etch. The displacement of the filler metal powder can be mechanical or chemical. Mechanical displacement can be provided by mechanical brushing, sand blasting, air blowing or water rinsing. Chemical displacement can be provided by a wet chemical etchant that dissolves the filler metal powder.

Anisotropic etching as used herein refers to etching in which the horizontal etch rate is small compared to the vertical etch rate, and isotropic etching as used herein refers to etching in which the horizontal etch rate is significant compared to the vertical etch rate. Stated differently, anisotropic etching refers to a high degree of anisotropy, and isotropic etching refers to a low degree of anisotropy. Thus, anisotropic etching includes both complete directional preference and predominant directional preference, and isotropic etching includes both no directional preference and minor directional preference.

Numerous insulative adhesives can be applied between the conductive trace and the chip. For instance, the insulative adhesive can be applied as a paste or a liquid applied by screen-printing, spin-on, or spray-on. Thermosetting insulative adhesive liquids and pastes such as epoxies are generally suitable. Likewise, thermoplastic insulative adhesives such as a thermoplastic polyimide film with a glass transition temperature (Tg) of 400° C. are also generally suitable. Silicone insulative adhesives can also be used.

The opening in the insulative adhesive can be formed with numerous etching techniques including selective plasma etching and projection laser ablation. The opening can have a circular, ovular, square, rectangular or other shape (as viewed from the top surface of the insulative adhesive). The opening may be aligned with and expose a single pad or a plurality of pads. Furthermore, the opening sidewalls may have a wide variety of shapes and slopes including vertical sidewalls, tapered sidewalls, continuous sidewalls and stepped sidewalls.

The encapsulant can be deposited on the chip using a wide variety of techniques including printing and transfer molding. In addition, the encapsulant can contact and/or mechanically support the conductive trace outside the periphery of the chip if the conductive trace extends beyond the periphery of the chip.

An insulative base can be formed over the conductive trace and the entire chip after removing the portion of the conductive adhesive in order to provide enhanced mechanical strength and protection from unwanted solder reflow during the next level assembly. The insulative base may be rigid or flexible, and can be various dielectric films formed from numerous organic or inorganic insulators such as tape (polyimide), epoxy, silicone, glass, aramid and ceramic. Organic insulators are preferred for low cost, high dielectric applications, whereas inorganic insulators are preferred when high thermal dissipation and a matched thermal coefficient of expansion are important. For instance, the insulative base can initially be an epoxy paste that includes an epoxy resin, a curing agent, an accelerator and a filler that is deposited over the conductive trace, the conductive adhesive and the chip after removing the portion of the conductive adhesive and subsequently cured or hardened to form a solid adherent insulative layer. The filler can be an inert material such as silica (powdered fused quartz) that improves thermal conductivity, thermal shock resistance and thermal coefficient of expansion matching. Organic fiber reinforcement may also be used in resins such as epoxy, cyanate ester, polyimide, PTFE and combinations thereof. Fibers that may be used include aramid, polyester, polyamide, poly-ether-ether-ketone, polyimide, polyetherimide and polysulfone. The fiber reinforcement can be woven fabric, woven glass, random microfiber glass, woven quartz, woven, aramid, non-woven fabric, non-woven aramid fiber or paper.

Further encapsulation can be performed if desired to enhance the mechanical strength of the assembly in the event the encapsulant and/or insulative base are particularly thin or omitted.

A soldering material or solder ball can be deposited over the conductive trace by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

The "upper" and "lower" surfaces of the chip and the "top" and "bottom" surfaces of the conductive trace do not depend on the orientation of the assembly, as will be readily apparent to those skilled in the art. For instance, the upper surface of the chip includes the pad and faces the bottom surface of the conductive trace, and the top surface of the conductive trace faces away from the chip, regardless of whether the assembly is inverted and/or mounted on a printed circuit board. Similarly, the conductive trace is disposed "above" the chip when the bottom surface of the conductive trace faces the upper surface of the chip regardless of whether the assembly is inverted, rotated or slanted. Likewise, the conductive trace is shown above the chip and the metal base is shown above the conductive trace with a single orientation throughout the drawings for ease of comparison between the figures, although the assembly and its components may be inverted at various manufacturing stages.

The working format for the semiconductor chip assembly can be a single chip, a wafer, a strip or a panel based on the manufacturing design. For instance, when the working format is a wafer, numerous assemblies are simultaneously batch manufactured on a single wafer and then separated from one another during singulation. As another example, when the working format is a strip (or reel-to-reel) form, the chips are individually attached to the strip. Semiconductor chip assemblies manufactured using a strip can be chip scale packages, chip size packages, bump grid arrays, or other structures. The wafer-based approach employs fewer steps and is less time consuming than the strip-based approach, however the strip-based approach is easier to control and has better dimensional stability than the wafer-based approach since aligning the conductive traces with the pads involves a single chip rather than the entire wafer.

Advantageously, the semiconductor chip assembly of the present invention is reliable and inexpensive. The encapsulant and/or insulative base protects the chip from handling damage, and the insulative adhesive and/or insulative base provides a known dielectric barrier for the conductive trace. The conductive adhesive provides mechanical and metallurgical coupling between the conductive trace and the chip. Furthermore, the conductive trace can be mechanically and metallurgically coupled to the chip without wire bonding, TAB, plating, polishing or soldering. As a result, the assembly of the present invention significantly enhances throughput, yield and cost effectiveness compared to conventional packaging techniques. Moreover, the assembly of the present invention is well-suited for use with materials compatible with copper chip and lead-free environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A method of connecting a conductive trace to a semiconductor chip, comprising:

providing a semiconductor chip that includes a conductive pad;

providing a conductive trace; then disposing a conductive adhesive between the conductive trace and the chip, thereby mechanically attaching the conductive trace to the chip such that the conductive trace overlaps the pad and the conductive adhesive contacts and is sandwiched between and electrically connects the conductive trace and the pad; and then removing a portion of the conductive adhesive such that the conductive adhesive still contacts and is sandwiched between and electrically connects the conductive trace and the pad and the conductive adhesive no longer electrically connects the conductive trace to a conductor external to the chip.

2. The method of claim 1, wherein providing the conductive trace includes electroplating the conductive trace on a metal base and then positioning the metal base such that the metal base overlaps four peripheral edges of the chip.

3. The method of claim 1, wherein providing the conductive trace includes electroplating the conductive trace on a metal base and disposing the conductive adhesive includes contacting the conductive adhesive to the metal base.

4. The method of claim 1, wherein disposing the conductive adhesive includes contacting the conductive adhesive to the conductive trace and the chip and then curing the conductive adhesive.

5. The method of claim 1, wherein disposing the conductive adhesive includes filling the conductive adhesive into an opening in a polymeric insulative adhesive that contacts the chip.

6. The method of claim 1, wherein removing the portion of the conductive adhesive includes attacking a polymer binder of the conductive adhesive using a plasma that chemically reacts with the polymer binder or a laser that ablates the polymer binder.

7. The method of claim 1, wherein removing the portion of the conductive adhesive includes displacing a filler metal powder of the conductive adhesive using mechanical brushing, sand blasting, air blowing, water rinsing or wet chemical etching.

8. The method of claim 1, wherein removing the portion of the conductive adhesive includes using the conductive trace as an etch mask.

9. The method of claim 1, wherein removing the portion of the conductive adhesive exposes opposing peripheral sidewalls of the conductive trace.

10. The method of claim 1, wherein removing the portion of the conductive adhesive exposes a polymeric insulative adhesive that contacts the chip.

11. The method of claim 1, wherein removing the portion of the conductive adhesive exposes the chip.

12. The method of claim 1, wherein removing the portion of the conductive adhesive exposes the pad.

13. The method of claim 1, wherein removing the portion of the conductive adhesive electrically isolates the conductive trace from another conductive trace that is external to the chip and electrically connected to another conductive pad of the chip.

14. The method of claim 1, wherein the conductive trace overlaps only one peripheral edge of the pad after mechanically attaching the conductive trace to the chip.

15. The method of claim 1, wherein the conductive trace overlaps only two peripheral edges of the pad, and the two peripheral edges are opposite one another, after mechanically attaching the conductive trace to the chip.

16. The method of claim 1, wherein the conductive adhesive includes a polymer binder and a filler metal powder.

17. The method of claim 1, wherein the conductive adhesive is coplanar with and adjacent to a surface of the conductive trace that overlaps and faces away from the pad after mechanically attaching the conductive trace to the chip and before removing the portion of the conductive adhesive.

18. The method of claim 1, wherein the conductive adhesive contacts a surface of the conductive trace that overlaps and faces towards the pad and opposing peripheral sidewalls of the conductive trace after mechanically attaching the conductive trace to the chip and before removing the portion of the conductive adhesive.

19. The method of claim 1, wherein the conductive adhesive contacts substantially none of a surface of the conductive trace that overlaps and faces away from the pad after mechanically attaching the conductive trace to the chip and before removing the portion of the conductive adhesive.

20. The method of claim 1, wherein the conductive adhesive is the only electrical conductor external to the chip that contacts the pad and the conductive adhesive is the only electrical conductor that contacts both the conductive trace and the pad.

21. A method of connecting a conductive trace to a semiconductor chip, comprising:
providing a semiconductor chip that includes a conductive pad;
providing a conductive trace with first and second surfaces that are opposite one another and opposing peripheral sidewalls between the surfaces;
providing a conductive adhesive on the second surface, the peripheral sidewalls and the pad; then
curing the conductive adhesive, thereby mechanically attaching the conductive trace to the chip, wherein the conductive trace overlaps the pad, first surface faces away from the pad, the second surface faces towards the pad, and the conductive adhesive contacts the second surface, the peripheral sidewalls and the pad, is sandwiched between the second surface and the pad and electrically connects the conductive trace and the pad; and then
removing a portion of the conductive adhesive using the conductive trace as an etch mask, thereby exposing the peripheral sidewalls, wherein the conductive adhesive still contacts and is sandwiched between the second surface and the pad and electrically connects the conductive trace and the pad, the conductive adhesive is the only electrical conductor external to the chip that contacts the pad, and the conductive adhesive is the only material that contacts both the conductive trace and the pad.

22. The method of claim 21, wherein providing the conductive adhesive includes depositing the conductive adhesive using screen printing.

23. The method of claim 21, wherein providing the conductive adhesive includes depositing the conductive adhesive using stencil printing.

24. The method of claim 21, wherein removing the portion of the conductive adhesive includes attacking a polymer binder of the conductive adhesive using a plasma that chemically reacts with the polymer binder or a laser that ablates the polymer binder.

25. The method of claim 21, wherein removing the portion of the conductive adhesive includes displacing a filler metal powder of the conductive adhesive using mechanical brushing, sand blasting, air blowing, water rinsing or wet chemical etching.

26. The method of claim 21, wherein curing the conductive adhesive includes applying heat to the conductive adhesive.

27. The method of claim 21, wherein curing the conductive adhesive includes applying UV light to the conductive adhesive.

28. The method of claim 21, wherein the conductive adhesive includes a polymer binder and a filler metal powder.

29. The method of claim 21, wherein the conductive adhesive includes an epoxy binder and silver powder.

30. The method of claim 21, wherein the conductive adhesive includes a conductive polymer.

31. A method of connecting a conductive trace to a semiconductor chip, comprising:
providing a semiconductor chip that includes a conductive pad;
providing a conductive trace; then
providing an adhesive that contacts and is sandwiched between and mechanically attaches the conductive trace and the chip, wherein the adhesive includes a conductive adhesive that contacts and is sandwiched between and electrically connects the conductive trace and the pad; and then
removing a portion of the adhesive, thereby exposing the chip while the conductive adhesive still contacts and is sandwiched between and electrically connects the conductive trace and the pad.

32. The method of claim 31, wherein removing the portion of the adhesive includes using the conductive trace as an etch mask.

33. The method of claim 31, wherein removing the portion of the adhesive includes applying a first removal step and then applying a second removal step.

34. The method of claim 33, wherein the first removal step is provided by a plasma or a laser, and the second removal step is provided by mechanical brushing, sand blasting, air blowing, water rinsing or wet chemical etching.

35. The method of claim 33, wherein the first removal step attacks a polymer binder of the conductive adhesive and loosens a filler metal powder of the conductive adhesive, and the second removal step displaces the filler metal powder.

36. The method of claim 31, wherein removing the portion of the adhesive exposes opposing peripheral sidewalls of the conductive trace that are orthogonal to the pad.

37. The method of claim 31, wherein the adhesive consists of the conductive adhesive.

38. The method of claim 31, wherein the adhesive consists of an insulative adhesive and the conductive adhesive, the insulative adhesive contacts the chip and is spaced from the conductive trace, and the conductive adhesive extends through an opening in the insulative adhesive above the pad.

39. The method of claim 38, wherein the insulative adhesive is silicone, polyimide or epoxy.

40. The method of claim 38, wherein the conductive adhesive includes a polymer binder and a filler metal powder.

41. A method of connecting a conductive trace to a semiconductor chip, comprising:
  providing a semiconductor chip that includes a conductive pad;
  attaching a conductive trace to a metal base; then
  disposing a conductive adhesive between the conductive trace and the chip, thereby mechanically attaching the conductive trace to the chip such that the conductive trace overlaps the pad and the conductive adhesive contacts and is sandwiched between and electrically connects the conductive trace and the pad; then
  etching the metal base, thereby exposing the conductive trace and the conductive adhesive; and then
  removing a portion of the conductive adhesive.

42. The method of claim 41, wherein attaching the conductive trace to the metal base includes electroplating the conductive trace on the metal base.

43. The method of claim 41, wherein disposing the conductive adhesive includes contacting the conductive adhesive to the metal base.

44. The method of claim 41, wherein etching the metal base includes applying a wet chemical etch that is selective of the metal base with respect to the conductive trace and the conductive adhesive.

45. The method of claim 41, wherein etching the metal base removes the metal base.

46. The method of claim 41, wherein removing the portion of the conductive adhesive exposes the chip.

47. The method of claim 41, wherein removing the portion of the conductive adhesive exposes opposing peripheral sidewalls of the conductive trace.

48. The method of claim 41, wherein the conductive adhesive is coplanar with and adjacent to a surface of the conductive trace that contacts the metal base and overlaps and faces away from the pad after mechanically attaching the conductive trace to the chip and before etching the metal base.

49. The method of claim 41, wherein the conductive adhesive contacts a surface of the conductive trace that overlaps and faces towards the pad and opposing peripheral sidewalls of the conductive trace after mechanically attaching the conductive trace to the chip and before removing the portion of the conductive adhesive.

50. The method of claim 41, wherein the conductive adhesive contacts substantially none of a surface of the conductive trace that contacts the metal base and overlaps and faces away from the pad after mechanically attaching the conductive trace to the chip.

51. A method of connecting a conductive trace to a semiconductor chip, comprising the following steps in the sequence set forth:
  providing a metal base;
  providing a plating mask on the metal base, wherein the plating mask includes an opening that exposes a portion of the metal base;
  electroplating a conductive trace on the exposed portion of the metal base through the opening in the plating mask, wherein the conductive trace includes top and bottom surfaces, the top surface contacts the metal base, and the bottom surface is exposed;
  removing the plating mask, thereby exposing peripheral sidewalls of the conductive trace between the top and bottom surfaces;
  mechanically attaching the conductive trace to a semiconductor chip using a conductive adhesive, wherein the chip includes upper and lower surfaces, the upper surface includes a conductive pad, the conductive trace overlaps the pad, and the conductive adhesive contacts and is sandwiched between and electrically connects the conductive trace and the pad;
  etching the metal base, thereby exposing the top surface and the conductive adhesive; and
  removing a first portion of the conductive adhesive, thereby exposing the chip such that a second portion of the conductive adhesive still contacts and is sandwiched between and electrically connects the conductive trace and the pad.

52. The method of claim 51, wherein mechanically attaching the conductive trace to the chip includes contacting the conductive adhesive to the metal base.

53. The method of claim 51, wherein etching the metal base removes all of the metal base within a periphery of the chip.

54. The method of claim 51, wherein removing the first portion of the conductive adhesive includes using the conductive trace as an etch mask.

55. The method of claim 51, wherein removing the first portion of the conductive adhesive exposes a passivation layer included in the upper surface of the chip.

56. The method of claim 51, wherein removing the first portion of the conductive adhesive exposes the pad.

57. The method of claim 51, wherein the plating mask is photoresist.

58. The method of claim 51, wherein the conductive adhesive includes a polymer binder and a filler metal powder.

59. The method of claim 51, wherein the conductive adhesive is coplanar with and adjacent to and contacts substantially none of the top surface after mechanically attaching the conductive trace to the chip and before etching the metal base, the conductive adhesive contacts substantially all of the bottom surface and substantially all of the peripheral sidewalls after mechanically attaching the conductive trace to the chip and before removing the first portion of the conductive adhesive, and the conductive adhesive contacts the bottom surface and substantially none of the peripheral sidewalls after removing the first portion of the conductive adhesive.

60. The method of claim 51, including forming an encapsulant that contacts the lower surface of the chip after mechanically attaching the conductive trace to the chip and before etching the metal base.

61. A method of connecting conductive traces to a semiconductor chip, comprising:
  providing a semiconductor chip that includes a first and second conductive pads;
  providing first and second conductive traces; then
  disposing a conductive adhesive between the conductive traces and the chip, thereby mechanically attaching the conductive traces to the chip such that the first conductive trace overlaps the first pad, the second conductive trace overlaps the second pad, the conductive adhesive contacts and is sandwiched between and electrically connects the first conductive trace and the first pad, the conductive adhesive contacts and is sandwiched between and electrically connects the second conductive trace and the second pad, and the conductive adhesive electrically connects the conductive traces; and then removing a portion of the conductive adhesive such that the conductive adhesive still contacts and is sandwiched between and electrically connects the first conductive trace and the first pad, the conductive adhesive still contacts and is sandwiched between and electrically connects the second conductive trace and the second pad, and the conductive adhesive no longer electrically connects the conductive traces.

62. The method of claim 61, wherein providing the conductive traces includes electroplating the conductive traces on a metal base and then positioning the metal base such that the metal base overlaps four peripheral edges of the chip.

63. The method of claim 61, wherein providing the conductive traces includes electroplating the conductive traces on a metal base and disposing the conductive adhesive includes contacting the conductive adhesive to the metal base.

64. The method of claim 61, wherein disposing the conductive adhesive includes contacting the conductive adhesive to the conductive traces and the chip and then curing the conductive adhesive.

65. The method of claim 61, wherein disposing the conductive adhesive includes filling the conductive adhesive into first and second openings in a polymeric insulative adhesive that contacts the chip, and wherein the first opening is aligned with the first pad and the second opening is aligned with the second pad.

66. The method of claim 61, wherein removing the portion of the conductive adhesive includes attacking a polymer binder of the conductive adhesive using a plasma that chemically reacts with the polymer binder or a laser that ablates the polymer binder.

67. The method of claim 61, wherein removing the portion of the conductive adhesive includes displacing a filler metal powder of the conductive adhesive using mechanical brushing, sand blasting, air blowing, water rinsing or wet chemical etching.

68. The method of claim 61, wherein removing the portion of the conductive adhesive includes applying an etch that is selective of the conductive adhesive with respect to the conductive traces using the conductive traces as an etch mask.

69. The method of claim 61, wherein removing the portion of the conductive adhesive exposes opposing peripheral sidewalls of the conductive traces.

70. The method of claim 61, wherein removing the portion of the conductive adhesive exposes a polymeric insulative adhesive that contacts the chip.

71. The method of claim 61, wherein removing the portion of the conductive adhesive exposes the chip.

72. The method of claim 61, wherein removing the portion of the conductive adhesive exposes the pads.

73. The method of claim 61, wherein removing the portion of the conductive adhesive electrically isolates the conductive traces from one another and electrically isolates the pads from one another.

74. The method of claim 61, wherein the first conductive trace overlaps only one peripheral edge of the first pad and the second conductive trace overlaps only one peripheral edge of the second pad after mechanically attaching the conductive traces to the chip.

75. The method of claim 61, wherein the first conductive trace overlaps only two peripheral edges of the first pad that are opposite one another and the second conductive trace overlaps only two peripheral edges of the second pad that are opposite one another after mechanically attaching the conductive traces to the chip.

76. The method of claim 61, wherein the conductive adhesive includes a polymer binder and a filler metal powder.

77. The method of claim 61, wherein the conductive adhesive is coplanar with and adjacent to a surface of the first conductive trace that overlaps and faces away from the first pad and to a surface of the second conductive trace that overlaps and faces away from the second pad after mechanically attaching the conductive traces to the chip and before removing the portion of the conductive adhesive.

78. The method of claim 61, wherein the conductive adhesive contacts a surface of the first conductive trace that overlaps and faces towards the first pad and opposing peripheral sidewalls of the first conductive trace and a surface of the second conductive trace that overlaps and faces towards the second pad and opposing peripheral sidewalls of the second conductive trace after mechanically attaching the conductive traces to the chip and before removing the portion of the conductive adhesive.

79. The method of claim 61, wherein the conductive adhesive contacts substantially none of a surface of the first conductive trace that overlaps and faces away from the first pad and substantially none of a surface of the second conductive trace that overlaps and faces away from the second pad after mechanically attaching the conductive traces to the chip and before removing the portion of the conductive adhesive.

80. The method of claim 61, wherein the conductive adhesive is the only electrical conductor external to the chip that contacts the first pad, the conductive adhesive is the only electrical conductor external to the chip that contacts the second pad, the conductive adhesive is the only electrical conductor that contacts both the first conductive trace and the first pad, and the conductive adhesive is the only electrical conductor that contacts both the second conductive trace and the second pad.

81. A method of connecting conductive traces to a semiconductor chip, comprising:
    providing a semiconductor chip that includes first and second conductive pads;
    depositing first and second conductive traces on a metal base such that the metal base electrically connects the conductive traces; then
    disposing a conductive adhesive between the conductive traces and the chip, thereby mechanically attaching the conductive traces to the chip such that the first conductive trace overlaps the first pad, the second conductive trace overlaps the second pad, the conductive adhesive contacts and is sandwiched between and electrically connects the first conductive trace and the first pad, the conductive adhesive contacts and is sandwiched between and electrically connects the second conductive trace and the second pad, and the conductive adhesive electrically connects the conductive traces; then
    etching the metal base such that the metal base no longer electrically connects the conductive traces; and then
    removing a portion of the conductive adhesive such that the conductive adhesive still contacts and is sandwiched between and electrically connects the first conductive trace and the first pad, the conductive adhesive still contacts and is sandwiched between and electrically connects the second conductive trace and the second pad, the conductive adhesive no longer electrically connects the conductive traces, and the conductive traces are electrically isolated from one another.

82. The method of claim 81, wherein depositing the conductive traces on the metal base includes simultaneously electroplating the conductive traces on the metal base through openings in a plating mask.

83. The method of claim 81, wherein disposing the conductive adhesive includes contacting the conductive adhesive to the metal base.

84. The method of claim 81, wherein etching the metal base includes applying a wet chemical etch that is selective of the metal base with respect to the conductive traces and the conductive adhesive, thereby removing all of the metal base within a periphery of the chip.

85. The method of claim 81, wherein removing the portion of the conductive adhesive includes applying an etch that is selective of the conductive adhesive with respect to the conductive traces using the conductive traces as an etch mask, thereby exposing peripheral sidewalls of the conductive traces and a passivation layer of the chip.

86. The method of claim 81, wherein the conductive adhesive includes a polymer binder and a filler metal powder.

87. The method of claim 81, wherein the conductive adhesive is coplanar with and adjacent to a surface of the first conductive trace that overlaps and faces away from the first pad and to a surface of the second conductive trace that overlaps and faces away from the second pad after mechanically attaching the conductive traces to the chip and before removing the portion of the conductive adhesive.

88. The method of claim 81, wherein the conductive adhesive contacts a surface of the first conductive trace that overlaps and faces towards the first pad and opposing peripheral sidewalls of the first conductive trace and a surface of the second conductive trace that overlaps and faces towards the second pad and opposing peripheral sidewalls of the second conductive trace after mechanically attaching the conductive traces to the chip and before removing the portion of the conductive adhesive.

89. The method of claim 81, wherein the conductive adhesive contacts substantially none of a surface of the first conductive trace that overlaps and faces away from the first pad and substantially none of a surface of the second conductive trace that overlaps and faces away from the second pad after mechanically attaching the conductive traces to the chip and before removing the portion of the conductive adhesive.

90. The method of claim 81, wherein the conductive adhesive is the only electrical conductor external to the chip that contacts the first pad, the conductive adhesive is the only electrical conductor external to the chip that contacts the second pad, the conductive adhesive is the only electrical conductor that contacts both the first conductive trace and the first pad, and the conductive adhesive is the only electrical conductor that contacts both the second conductive trace and the second pad.

91. A method of connecting conductive traces to a semiconductor chip, comprising:
providing a semiconductor chip that includes first and second conductive pads;
depositing first and second conductive traces on a metal base such that the metal base electrically connects the conductive traces;
depositing a conductive adhesive on the conductive traces and the metal base; then
disposing the conductive adhesive between the conductive traces and the chip, thereby mechanically attaching the conductive traces to the chip such that the first conductive trace overlaps the first pad, the second conductive trace overlaps the second pad, the conductive adhesive contacts and is sandwiched between and electrically connects the first conductive trace and the first pad, the conductive adhesive contacts and is sandwiched between and electrically connects the second conductive trace and the second pad, and the conductive adhesive electrically connects the conductive traces; then
etching the metal base, thereby exposing the conductive traces and the conductive adhesive such that the metal base no longer electrically connects the conductive traces; and then
removing a portion of the conductive adhesive, thereby exposing the chip such that the conductive adhesive still contacts and is sandwiched between and electrically connects the first conductive trace and the first pad, the conductive adhesive still contacts and is sandwiched between and electrically connects the second conductive trace and the second pad, the conductive adhesive no longer electrically connects the conductive traces, and the conductive traces are electrically isolated from one another.

92. The method of claim 91, wherein depositing the conductive traces on the metal base includes simultaneously electroplating the conductive traces on the metal base through openings in a plating mask.

93. The method of claim 91, wherein disposing the conductive adhesive includes contacting the conductive adhesive to the chip and then curing the conductive adhesive.

94. The method of claim 91, wherein etching the metal base includes applying a wet chemical etch that is selective of the metal base with respect to the conductive traces and the conductive adhesive, thereby removing all of the metal base within a periphery of the chip.

95. The method of claim 91, wherein removing the portion of the conductive adhesive includes applying an etch that is selective of the conductive adhesive with respect to the conductive traces using the conductive traces as an etch mask, thereby exposing peripheral sidewalls of the conductive traces and a passivation layer of the chip.

96. The method of claim 91, wherein the conductive adhesive includes a polymer binder and a filler metal powder.

97. The method of claim 91, wherein the conductive adhesive is coplanar with and adjacent to a surface of the first conductive trace that overlaps and faces away from the first pad and to a surface of the second conductive trace that overlaps and faces away from the second pad after mechanically attaching the conductive traces to the chip and before removing the portion of the conductive adhesive.

98. The method of claim 91, wherein the conductive adhesive contacts a surface of the first conductive trace that overlaps and faces towards the first pad and opposing peripheral sidewalls of the first conductive trace and a surface of the second conductive trace that overlaps and faces towards the second pad and opposing peripheral sidewalls of the second conductive trace after mechanically attaching the conductive traces to the chip and before removing the portion of the conductive adhesive.

99. The method of claim 91, wherein the conductive adhesive contacts substantially none of a surface of the first conductive trace that overlaps and faces away from the first pad and substantially none of a surface of the second conductive trace that overlaps and faces away from the second pad after mechanically attaching the conductive traces to the chip and before removing the portion of the conductive adhesive.

100. The method of claim 91, wherein the conductive adhesive is the only electrical conductor external to the chip that contacts the first pad, the conductive adhesive is the only electrical conductor external to the chip that contacts the second pad, the conductive adhesive is the only electrical conductor that contacts both the first conductive trace and the first pad, and the conductive adhesive is the only electrical conductor that contacts both the second conductive trace and the second pad.

* * * * *